US011069706B2

(12) United States Patent
Lee et al.

(10) Patent No.: US 11,069,706 B2
(45) Date of Patent: Jul. 20, 2021

(54) THREE-DIMENSIONAL SEMICONDUCTOR MEMORY DEVICES

(71) Applicant: SAMSUNG ELECTRONICS CO., LTD., Suwon-si (KR)

(72) Inventors: Kang-Won Lee, Hwaseong-si (KR); Jaeyoung Song, Hwaseong-si (KR); Dong-Sik Lee, Hwaseong-si (KR); Donghoon Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 16/573,695

(22) Filed: Sep. 17, 2019

(65) Prior Publication Data

US 2020/0194457 A1 Jun. 18, 2020

(30) Foreign Application Priority Data

Dec. 12, 2018 (KR) .......................... 10-2018-0160216

(51) Int. Cl.
| | |
|---|---|
| *H01L 27/11582* | (2017.01) |
| *H01L 27/1157* | (2017.01) |
| *H01L 27/115* | (2017.01) |
| *H01L 23/522* | (2006.01) |
| *H01L 23/528* | (2006.01) |
| *H01L 27/06* | (2006.01) |
| *H01L 29/66* | (2006.01) |
| *H01L 29/792* | (2006.01) |
| *H01L 27/11575* | (2017.01) |
| *H01L 27/11556* | (2017.01) |

(52) U.S. Cl.
CPC .... *H01L 27/11582* (2013.01); *H01L 23/5226* (2013.01); *H01L 27/1157* (2013.01)

(58) Field of Classification Search
CPC ................................................ H01L 27/11582
See application file for complete search history.

(56) References Cited

U.S. PATENT DOCUMENTS

| 8,809,938 B2 | 8/2014 | Hwang et al. |
| 9,627,403 B2 | 4/2017 | Liu et al. |
| (Continued) | | |

FOREIGN PATENT DOCUMENTS

| JP | 5908389 | 4/2016 |
| KR | 10-1738103 | 5/2017 |

*Primary Examiner* — Omar F Mojaddedi
(74) *Attorney, Agent, or Firm* — F. Chau & Associates, LLC

(57) ABSTRACT

In a 3D semiconductor memory device, a stack structure includes electrodes and first insulating layers disposed between the electrodes. The stack structure has a stair structure on a connection region. A vertical channel structure penetrates the stack structure on a cell array region. A vertical dummy structure penates the stair structure on the connection region. A second insulating layer is selectively disposed on the cell array region. A maximum thickness of the second insulating layer ranges from 1.5 times to 10 times a maximum thickness of the first insulating layer on the second insulating layer. The vertical channel structure includes an abrupt diameter change at a level of a top surface of the second insulating layer. The abrupt diameter change has a surface which is parallel to the top surface of the second insulating layer and is substantially coplanar with the top surface of the second insulating layer.

9 Claims, 30 Drawing Sheets

(56) References Cited

U.S. PATENT DOCUMENTS

| | | |
|---|---|---|
| 9,691,781 B1 | 6/2017 | Nishikawa et al. |
| 9,741,738 B2 | 8/2017 | Fukuzumi et al. |
| 9,818,759 B2 | 11/2017 | Kai et al. |
| 9,881,929 B1 | 1/2018 | Ravikirthi et al. |
| 9,960,181 B1 | 5/2018 | Cui et al. |
| 9,978,766 B1 | 5/2018 | Hosoda et al. |
| 2016/0322381 A1* | 11/2016 | Liu .................. H01L 27/11582 |
| 2017/0236746 A1 | 8/2017 | Yu et al. |
| 2018/0130812 A1* | 5/2018 | Hosoda ............. H01L 27/11582 |
| 2018/0151497 A1 | 5/2018 | Makala et al. |
| 2018/0240811 A1 | 8/2018 | Kim et al. |
| 2019/0280000 A1* | 9/2019 | Nakamura ........ H01L 27/11575 |

\* cited by examiner

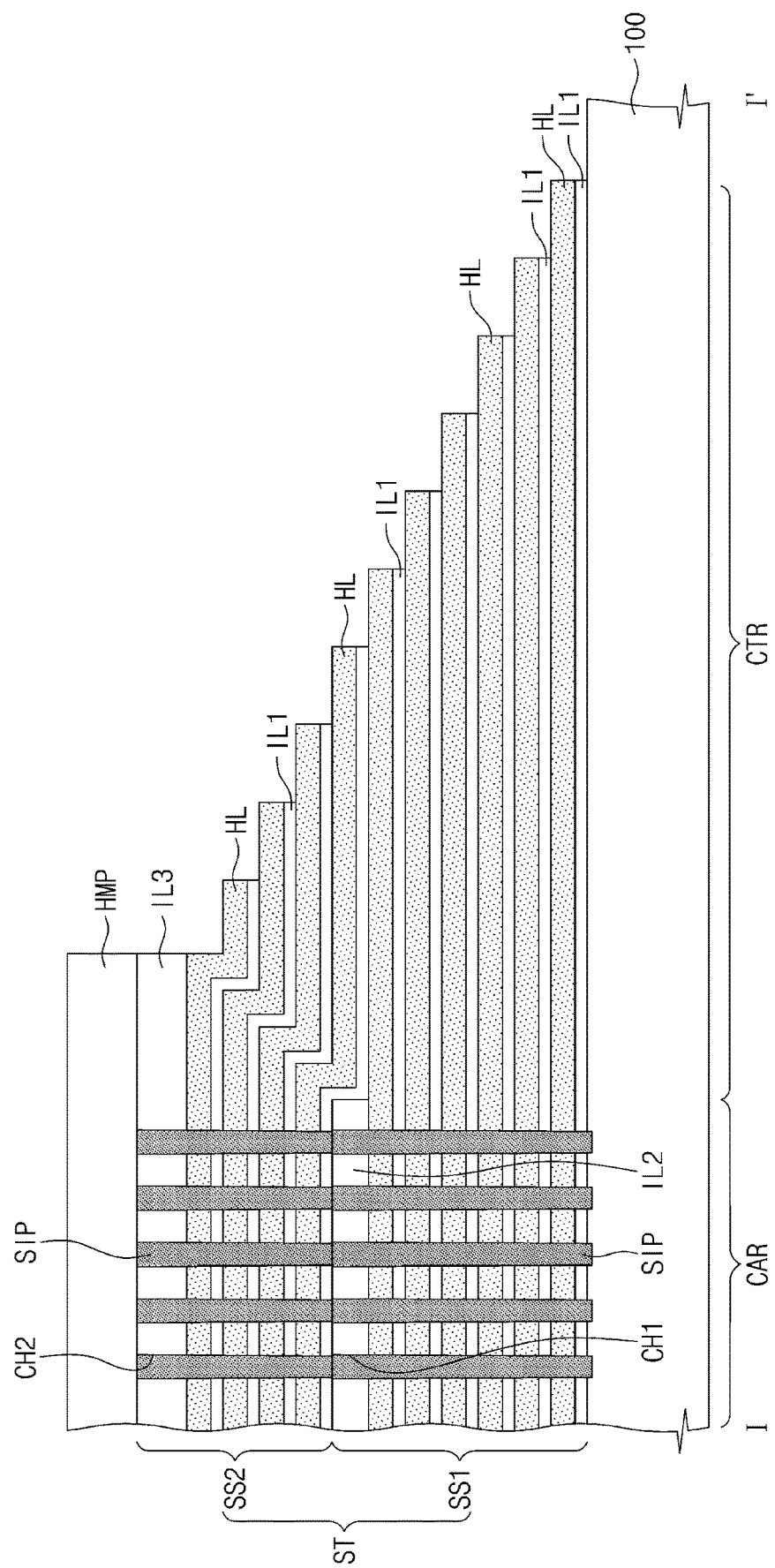

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2018-0160216, filed on Dec. 12, 2018, in the Korean Intellectual Property Office, the disclosure of which is hereby incorporated by reference in its entirety.

BACKGROUND

Technical Field

The present disclosure relates to a semiconductor device and, more particularly, to three-dimensional (3D) semiconductor memory devices.

Discussion of the Related Art

Modern semiconductor devices are being fabricated with a higher density of circuitry within a same or smaller die. This allows for digital devices to be made to have a higher performance and include fewer integrated circuits, thereby reducing the costs for production. Semiconductor devices having a higher density of circuitry may be referred to as being highly integrated. Semiconductor devices that include only a single level of circuitry are referred to as two-dimensional (2D) or planar semiconductor devices. In contrast, semiconductor devices that include a plurality of layers stacked on top of each other are referred to as three-dimensional (3D) semiconductor devices. By utilizing multiple layers of circuitry, higher integration may be achieved for a given fineness of lines. This may be particularly useful for producing memory devices, in which higher integration is particularly beneficial. Such memory devices may be known as 3D semiconductor memory devices and in these devices, memory cells may be three-dimensionally arranged.

SUMMARY

A three-dimensional (3D) semiconductor memory device includes a substrate including a cell array region and a connection region. A stack structure is disposed on the substrate and includes a plurality of electrodes and first insulating layers disposed between the electrodes. The stack structure has a stair structure on the connection region. A vertical channel structure penetrates the stack structure on the cell array region. A vertical dummy structure penates at least a portion of the stair structure on the connection region. The stack structure further includes a second insulating layer selectively disposed on the cell array region and not disposed on the connection region. A maximum thickness of the second insulating layer ranges from 1.5 times to 10 times a maximum thickness of the first insulating layer on the second insulating layer. The vertical channel structure includes a portion of abrupt diameter change at a level of a top surface of the second insulating layer. The portion of abrupt diameter change has a surface which is parallel to the top surface of the second insulating layer and is substantially coplanar with the top surface of the second insulating layer. An upper portion of the portion of abrupt diameter change has a first diameter, and a lower portion of the portion of abrupt diameter change has a second diameter that is greater than the first diameter.

A three-dimensional (3D) semiconductor memory device includes a substrate including a cell array region and a connection region. A stack structure is disposed on the substrate and includes a lower structure disposed on the substrate and an upper structure disposed on the lower structure. Each of the lower structure and the upper structure includes a plurality of stacked electrodes and first insulating layers disposed between the electrodes. A vertical channel structure penetrates the stack structure on the cell array region. The lower structure on the cell array region further includes a second insulating layer disposed on an uppermost portion thereof. A number of the electrodes of the plurality of electrodes of the lower structure on the cell array region is at least one less than a number of the electrodes of the plurality of electrodes of the lower structure on the connection region adjacent to the second insulating layer.

A three-dimensional (3D) semiconductor memory device includes a substrate including a cell array region and a connection region. A stack structure is disposed on the substrate and has a stair structure on the connection region. The stack structure includes a plurality of electrodes stacked and spaced apart from each other. A vertical channel structure penetrates the stack structure on the cell array region. The stack structure includes a first electrode, of the plurality of electrodes, that extends from the cell array region onto the connection region. An insulating layer is disposed on the first electrode of the cell array region. A second electrode, of the plurality of electrodes, is disposed on the first electrode of the connection region. The second electrode extends from a sidewall of the insulating layer onto the connection region.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 26 to 29 are cross-sectional views taken along the line I-I' of FIG. 3 illustrating a method of manufacturing the 3D semiconductor memory device of FIG. 25.

DETAILED DESCRIPTION OF THE EMBODIMENTS

Figure 1:
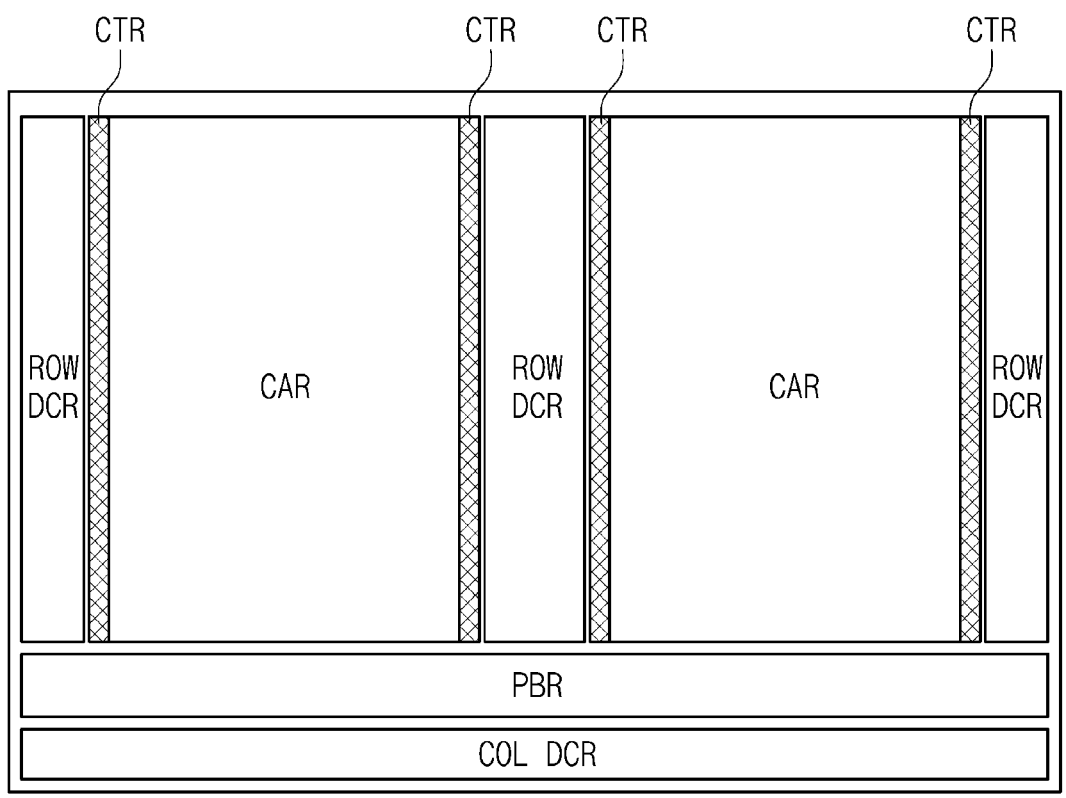
FIG. 1 is a schematic view illustrating a three-dimensional (3D) semiconductor memory device according to exemplary embodiments of the inventive concepts.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a schematic view illustrating a three-dimensional (3D) semiconductor memory device according to exemplary embodiments of the inventive concepts.

Referring to FIG. 1, a 3D semiconductor memory device may include a cell array region CAR and a peripheral circuit region. The peripheral circuit region may include row decoder regions ROW DCR, a page buffer region PBR, a column decoder region COL DCR, and a control circuit region. In exemplary embodiments of the present inventive concepts, a connection region CTR may be disposed between the cell array region CAR and the row decoder region ROW DCR.

A memory cell array including a plurality of memory cells may be disposed in the cell array region CAR. In exemplary embodiments of the present inventive concepts, the memory cell array may include three-dimensionally arranged memory cells, word lines, and bit lines. Each of the memory cells thereof may be connected to a word line and a bit line.

A row decoder for selecting the word lines of the memory cell array may be disposed in the row decoder region ROW DCR. An interconnection structure for electrically connecting the memory cell array to the row decoder may be disposed in the connection region CTR. The row decoder may select a word line among the plurality of word lines of the memory cell array in response to an address signal. The row decoder may respectively provide a first word line voltage and second word line voltages to the selected word line and unselected word lines in response to a control signal of a control circuit.

A page buffer for sensing data stored in the memory cells may be disposed in the page buffer region PBR. According to an operation mode (e.g. a program mode or a read mode), the page buffer may temporarily store data to be stored in the memory cells or may perform sense amplification when reading data that is already stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
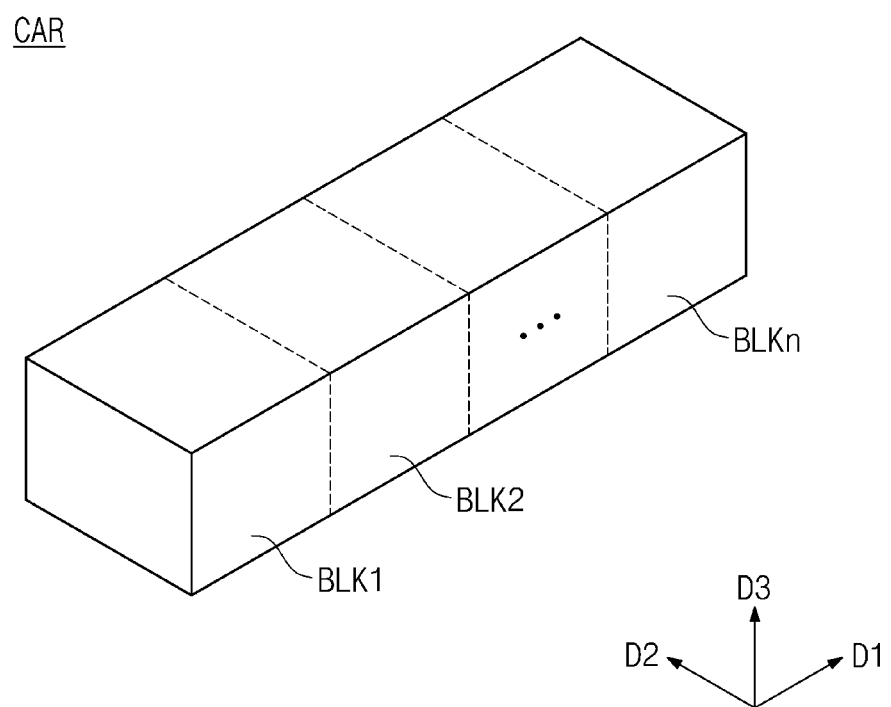
FIG. 2 is a schematic block diagram illustrating a cell array of a 3D semiconductor memory device according to exemplary embodiments of the inventive concepts.

FIG. 2 is a schematic block diagram illustrating a cell array of a 3D semiconductor memory device according to exemplary embodiments of the inventive concepts.

Referring to FIG. 2, the memory cell array may include a plurality of cell array blocks BLKI to BLKn. Each of the cell array blocks BLKI to BLKn may include a stack structure that includes electrodes stacked in a third direction D3 on a plane defined by first and second directions D1 and D2. The stack structure may be coupled to a plurality of vertical channel structures (e.g., semiconductor pillars) to constitute memory cells three-dimensionally arranged. In addition, each of the cell array blocks BLKI to BLKn may include bit lines electrically connected to the memory cells.

Figure 3:
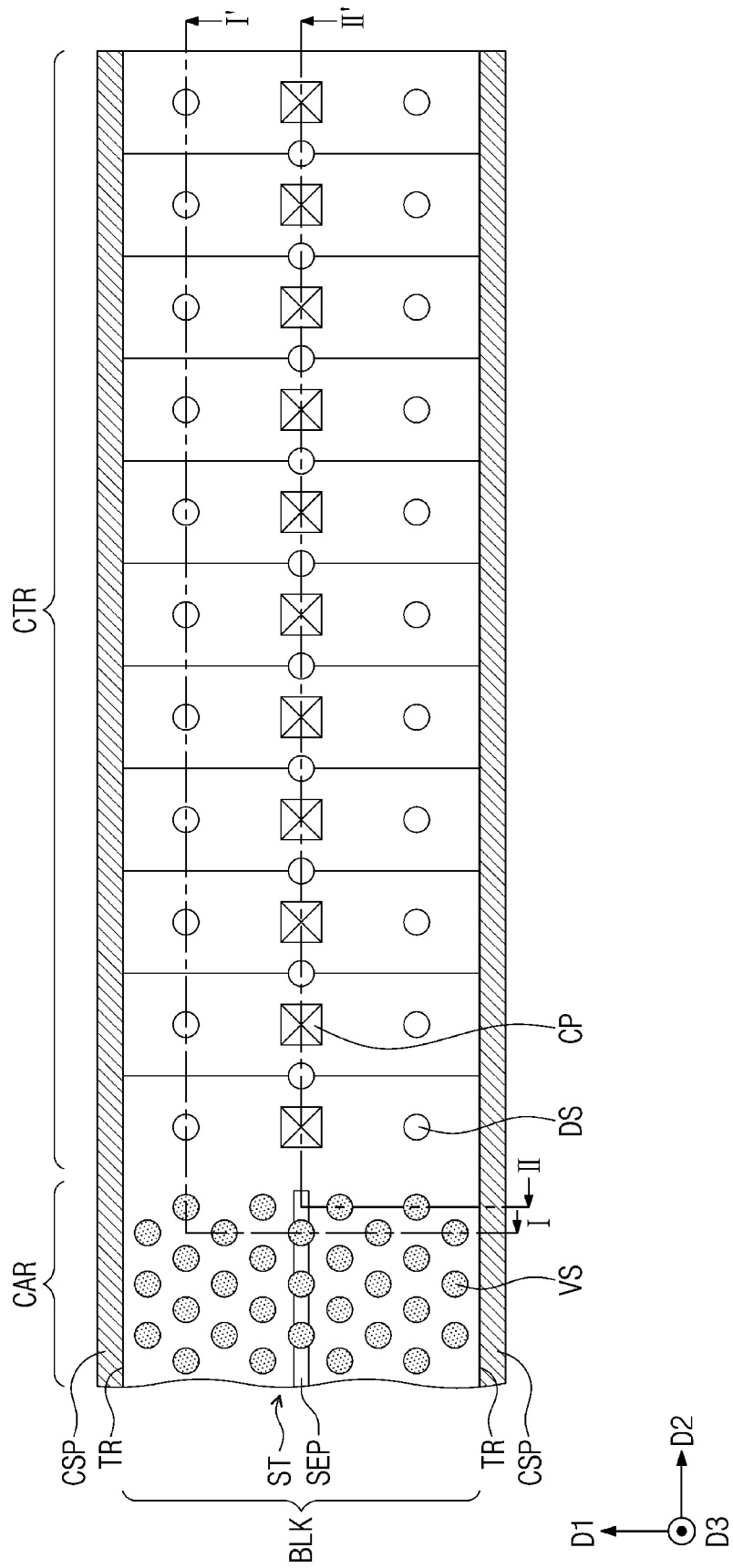
FIG. 3 is a plan view illustrating a 3D semiconductor memory device according to exemplary embodiments of the inventive concepts.
Figure 4A:
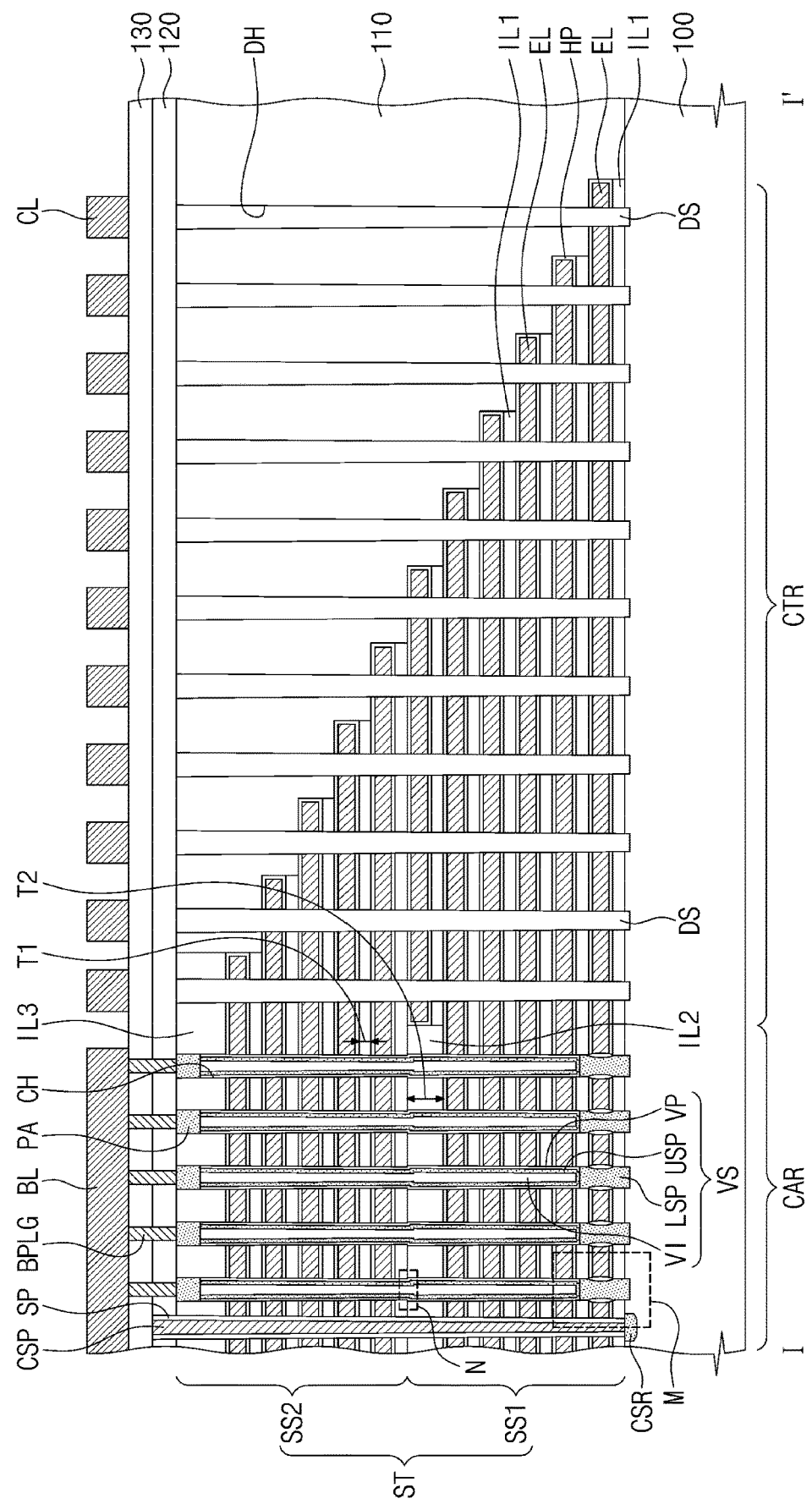
FIGS. 4A and 4B are cross-sectional views taken along lines I-I' and II-II' of FIG. 3, respectively.
Figure 4B:
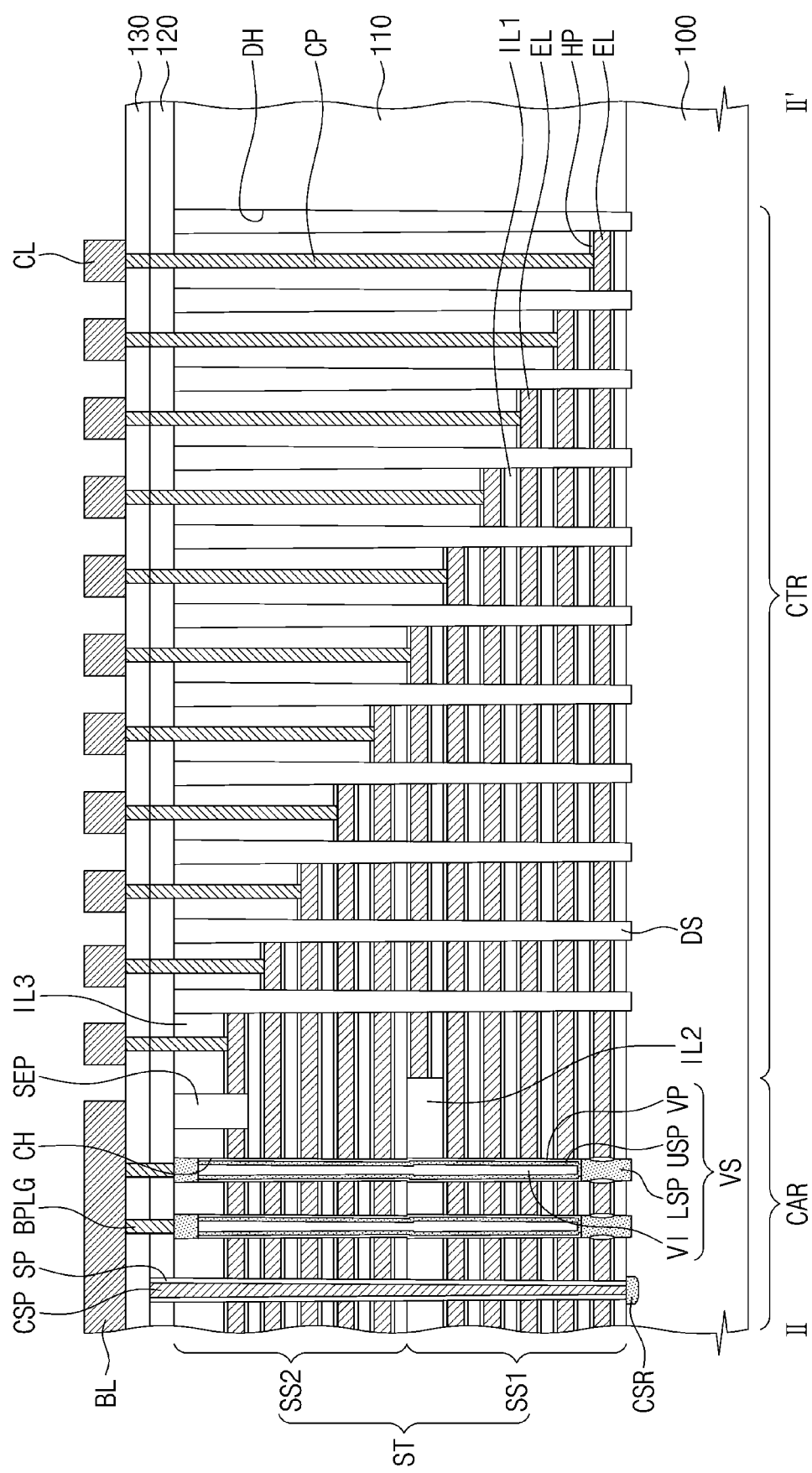
Figure 5A:
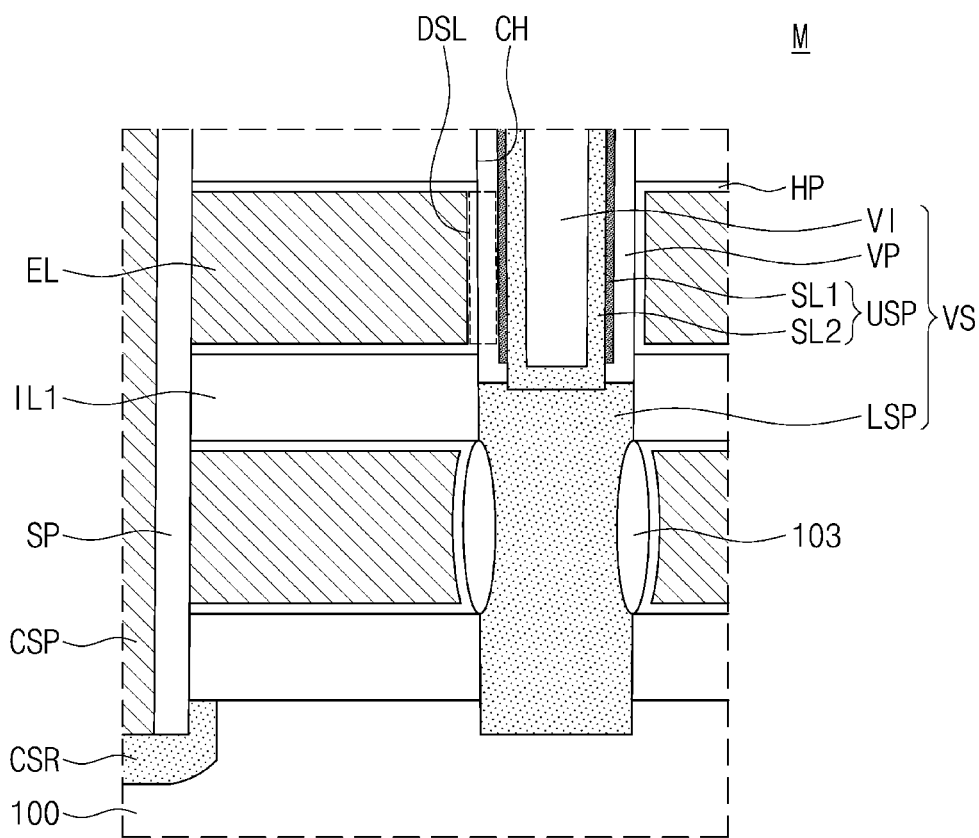
FIGS. 5A and 5B are enlarged cross-sectional views of regions 'M' and 'N' of FIG. 4A, respectively.
Figure 5B:
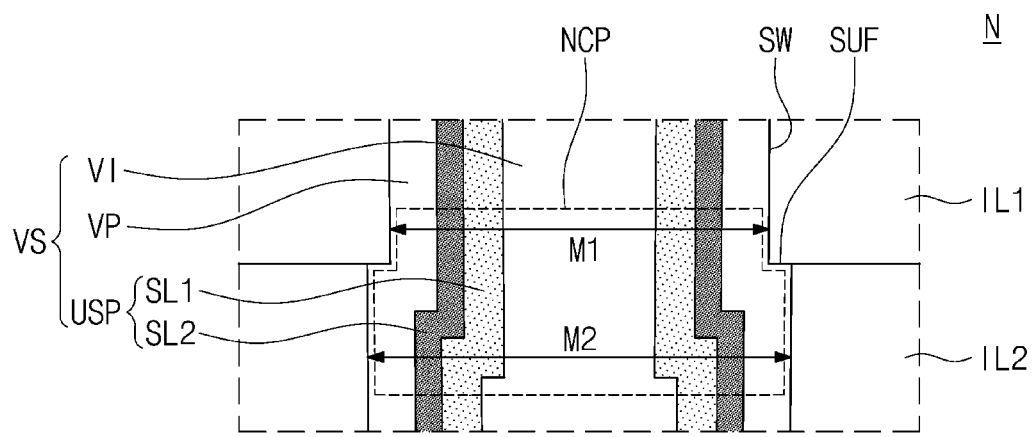

FIG. 3 is a plan view illustrating a 3D semiconductor memory device according to exemplary embodiments of the inventive concepts. FIGS. 4A and 4B are cross-sectional views taken along lines I-I' and II-II' of FIG. 3, respectively. FIGS. 5A and 5B are enlarged cross-sectional views of regions 'M' and 'N' of FIG. 4A, respectively.

Referring to FIGS. 3, 4A, 4B, 5A and 5B, a substrate 100 may be provided. The substrate 100 may include a cell array region CAR and a connection region CTR. For example, the substrate 100 may be a silicon substrate, a germanium substrate, or a silicon-germanium substrate. The substrate 100 may have a first conductivity type (e.g., a P-type).

A cell array block BLK may be disposed on the substrate 100. The cell array block BLK may include a stack structure ST that includes first insulating layers IL1 and electrodes EL which are vertically and alternately stacked. The stack structure ST may include a lower structure SS1 and an upper structure SS2. The upper structure SS2 may be disposed on the lower structure SS1. The stack structure ST may extend from the cell array region CAR onto the connection region CTR in a second direction D2. The stack structure ST may be provided in plural, and the plurality of stack structures ST may be arranged in a first direction D1 intersecting the second direction D2.

Common source regions CSR may be disposed at both sides of the stack structure ST. The common source regions CSR may be formed in an upper portion of the substrate 100.

The common source regions CSR may extend in parallel to the stack structure ST in the second direction D2. The common source regions CSR may be doped with dopants and may have a second conductivity type. For example, the common source regions CSR may be doped with dopants such as arsenic (As) or phosphorus (P) and may have an N-type.

A common source plug CSP may be connected to the common source region CSR. The common source plug CSP may vertically overlap with the common source region CSR in a cross-sectional view. The common source plug CSP may extend in parallel to the stack structure ST in the second direction D2. An insulating spacer SP may be disposed between the common source plug CSP and the stack structure ST.

The electrodes EL of the stack structure ST may be stacked along a third direction D3 substantially perpendicular to a top surface of the substrate 100. The electrodes EL vertically adjacent to each other may be separated from each other by the first insulating layer IL1 disposed therebetween. The electrodes EL may together have a stair structure on the connection region CTR. For example, a height of the stack structure ST on the connection region CTR may decrease stepwise as a horizontal distance from the cell array region CAR increases.

The lowermost electrode EL of the lower structure SS1 (e.g. the electrode EL closest to the substrate 100) may be a lower selection line. The uppermost electrode EL of the upper structure SS2 (e.g. the electrode EL farthest from the substrate 100) may be an upper selection line. The other electrodes EL of the lower and upper structures SS1 and SS2, except for the lower and upper selection lines, may correspond to word lines. A separation insulating pattern SEP may intersect the uppermost electrode EL (e.g., the upper selection line) and may extend in the second direction D2. The separation insulating pattern SEP may include an insulating material (e.g., silicon oxide).

The electrodes EL may include a conductive material. For example, the electrodes EL may include a doped semiconductor material (e.g., doped silicon), a metal (e.g., tungsten, copper, and/or aluminum), a conductive metal nitride (e.g., titanium nitride and/or tantalum nitride), and/or a transition metal (e.g., titanium and/or tantalum). For example, each of the first insulating layers IL1 may include a silicon oxide layer.

Planar areas of the electrodes EL on the connection region CTR may decrease sequentially as a distance from the top surface of the substrate 100 in the third direction D3 increases. The lowermost electrode EL (e.g., the lower selection line) of the stack structure ST on the connection region CTR may have the largest planar area and largest length. The uppermost electrode EL (e.g., the upper selection line) of the stack structure ST on the connection region CTR may have the smallest planar area and smallest length.

The stack structure ST of the cell array region CAR may include a second insulating layer IL2. The lower structure SS1 of the cell array region CAR may include the second insulating layer IL2 disposed in its uppermost portion. The second insulating layer IL2 may be selectively disposed on the cell array region CAR but might not be disposed on the connection region CTR. Each of the first insulating layers IL1 may have a first thickness T1. The second insulating layer IL2 may have a second thickness T2 that is greater than the first thickness T1. For example, the maximum thickness T2 of the second insulating layer IL2 may range from 1.5 times to 10 times the maximum thickness T1 of the first insulating layer IL1. The second insulating layer IL2 may include the same insulating material as the first insulating layer IL1. For example, the second insulating layer IL2 may include a silicon oxide layer.

The uppermost electrode EL of the lower structure SS1 may be selectively disposed on the connection region CTR but might not be disposed on the cell array region CAR. The uppermost electrode EL of the lower structure SS1 may be located at substantially the same level as the second insulating layer IL2. The uppermost electrode EL of the lower structure SS1 may extend from a sidewall of the second insulating layer IL2 onto the connection region CTR. For example, a top surface of a horizontal insulating layer HP surrounding the uppermost electrode EL of the lower structure SS1 may be substantially coplanar with a top surface of the second insulating layer IL2. For example, the number of the electrodes EL of the lower structure SS1 on the cell array region CAR may be less than the number of the electrodes EL of the lower structure SS1 on the connection region CTR. The number of the electrodes EL of the lower structure SS1 on the cell array region CAR may be at least one less than the number of the electrodes EL of the lower structure SS1 on the connection region CTR.

The uppermost first insulating layer IL1 of the lower structure SS1 may be selectively disposed on the connection region CTR but might not be disposed on the cell array region CAR. The uppermost first insulating layer IL1 of the lower structure SS1 may be located at substantially the same level as the second insulating layer IL2. For example, a bottom surface of the uppermost first insulating layer IL1 of the lower structure SS1 may be substantially coplanar with a bottom surface of the second insulating layer IL2.

The lowermost first insulating layer IL1 of the upper structure SS2 may cover the second insulating layer IL2 of the lower structure SS1 and the uppermost electrode EL of the lower structure SS1. The upper structure SS2 may include a third insulating layer IL3 disposed in its uppermost portion. For example, the third insulating layer IL3 may include a silicon oxide layer.

A plurality of vertical channel structures VS penetrating the stack structure ST may be disposed on the cell array region CAR. The vertical channel structures VS may be disposed in channel holes CH of the stack structure ST, respectively. For example, four vertical channel structures VS may be arranged in the first direction D1 to constitute a first column, and five vertical channel structures VS may be arranged in the first direction D1 to constitute a second column. The first column and the second column may be repeatedly and alternately arranged in the second direction D2.

Each of the vertical channel structures VS may include a vertical insulating layer VP, an upper semiconductor pattern USP, a lower semiconductor pattern LSP, and a filling insulation pattern VI. The vertical insulating layer VP may extend toward the substrate 100 along an inner sidewall of the channel hole CH. The upper semiconductor pattern USP may cover an inner sidewall of the vertical insulating layer VP and may extend together with the vertical insulating layer VP toward the substrate 100.

A conductive pad PA may be disposed on each of the vertical channel structures VS. The conductive pad PA may cover a top surface of the vertical insulating layer VP, a top surface of the upper semiconductor pattern USP, and a top surface of the filling insulation pattern VI. The conductive pad PA may include a semiconductor material doped with dopants, and/or a conductive material. A top surface of the conductive pad PA may be substantially coplanar with a top surface of the third insulating layer IL3 of the upper structure SS2. A bit line contact plug BPLG may be electrically connected to the upper semiconductor pattern USP through the conductive pad PA.

Referring again to FIG. 5A, the lower semiconductor pattern LSP may be disposed in a lower region of the channel hole CH and may be in direct contact with the substrate 100. The lower semiconductor pattern LSP may penetrate the lowermost electrode EL (e.g., the lower selection line) of the stack structure ST. An oxide pattern 103 may be disposed between the lower semiconductor pattern LSP and the lowermost electrode EL (e.g., the lower selection line). The upper semiconductor pattern USP may include a first semiconductor pattern SL1 and a second semiconductor pattern SL2. The second semiconductor pattern SL2 may be connected directly to the lower semiconductor pattern LSP. The second semiconductor pattern SL2 may have a tube shape of which a bottom end is closed. An inner space of the second semiconductor pattern SL2 may be filled with the filling insulation pattern VI. The second semiconductor pattern SL2 may be in contact with an inner sidewall of the first semiconductor pattern SL1. The second semiconductor pattern SL2 may electrically connect the first semiconductor pattern SL1 to the lower semiconductor pattern LSP. The first semiconductor pattern SL1 may have a tube shape of which top and bottom ends are opened. The first semiconductor pattern SL1 might not be in contact with the lower semiconductor pattern LSP but may be spaced apart from the lower semiconductor pattern LSP. The lower and upper semiconductor patterns LSP and USP may be used as channel regions of the 3D semiconductor memory device according to exemplary embodiments of the inventive concepts.

In exemplary embodiments of the present inventive concepts, the lower and upper semiconductor patterns LSP and USP may each include silicon (Si), germanium (Ge), or a combination thereof and may have different crystal structures from each other. Each of the lower and upper semiconductor patterns LSP and USP may have a crystal structure including a single-crystalline structure, an amorphous structure, and/or a poly-crystalline structure. The lower and upper semiconductor patterns LSP and USP may be undoped or may be doped with dopants having the same conductivity type (i.e., the first conductivity type) as the substrate 100.

In some exemplary embodiments, the lower semiconductor pattern LSP may be omitted. In this case, the upper semiconductor pattern USP may extend to the substrate 100 and may be in direct contact with the substrate 100. For example, the connection relationship between the vertical channel structure VS and the substrate 100 is not limited to the structure that is illustrated in FIG. 5A but may be variously modified.

Referring again to FIGS. 3, 4A and 4B, a diameter of the vertical channel structure VS in the lower structure SS1 may become progressively smaller toward the substrate 100. A diameter of the vertical channel structure VS in the upper structure SS2 may become progressively smaller toward the substrate 100. The diameter of the vertical channel structure VS may be abruptly changed in a region between the lower structure SS1 and the upper structure SS2.

Referring again to FIG. 5B, the vertical channel structure VS may include at least one portion of abrupt diameter change NCP. The portion of abrupt diameter change NCP may be disposed between the lower structure SS1 and the upper structure SS2. The second insulating layer IL2 may be adjacent to the portion of abrupt diameter change NCP.

An upper portion of the portion of abrupt diameter change NCP may have a first diameter M1, and a lower portion of the portion of abrupt diameter change NCP may have a second diameter M2. The diameter of the portion of abrupt diameter change NCP may increase abruptly (sharply) at an interface the upper structure SS2 and the lower structure SS1. Thus, the second diameter M2 may be greater than the first diameter M1. A sidewall SW of the vertical channel structure VS may have a stepped profile at the portion of abrupt diameter change NCP.

The portion of abrupt diameter change NCP may include a surface SUF located at the interface between the lower structure SS1 and the upper structure SS2. The surface SUF of the portion of abrupt diameter change NCP may be parallel to the top surface of the substrate 100. The top surface of the second insulating layer IL2 may be substantially coplanar with the surface SUF of the portion of abrupt diameter change NCP. For example, the sidewall SW of the vertical channel structure VS may include the surface SUF which is substantially coplanar with the top surface of the second insulating layer IL2.

Referring again to FIG. 5A, horizontal insulating layers HP may be disposed between the vertical channel structure VS and the electrodes EL, respectively. The horizontal insulating layer HP and the vertical insulating layer VP, which are disposed between the electrode EL and the upper semiconductor pattern USP, may constitute a data storage layer DSL.

The 3D semiconductor memory device according to exemplary embodiments of the inventive concepts may be an NAND flash memory device. For example, the data storage layer DSL between the electrode EL and the upper semiconductor pattern USP may include a tunnel insulating layer, a charge storage layer, and a blocking insulating layer. The tunnel insulating layer may be in direct contact with the upper semiconductor pattern USP. The blocking insulating layer may be in direct contact with the electrode EL. The charge storage layer may be disposed between the tunnel insulating layer and the blocking insulating layer. Data stored in the data storage layer DSL may be changed using a Fowler-Nordheim tunneling effect induced by a difference in voltage between the electrode EL and the upper semiconductor pattern USP.

The tunnel insulating layer may include a material of which an energy band gap is greater than that of the charge storage layer. For example, the tunnel insulating layer may include a high-k dielectric layer (e.g., an aluminum oxide layer or a hafnium oxide layer) and/or a silicon oxide layer. As used herein, the phrase "high-k" refers to a material having a dielectric constant ("k" or kappa) that is greater than or equal to the dielectric constant of silicon dioxide. The charge storage layer may include a silicon nitride layer, a silicon oxynitride layer, or a silicon-rich nitride layer. The blocking insulating layer may include a high-k dielectric layer (e.g., an aluminum oxide layer or a hafnium oxide layer) and/or a silicon oxide layer.

Referring again to FIGS. 3, 4A and 4B, contact plugs CP may be connected to the electrodes EL of the stack structure ST on the connection region CTR. In exemplary embodiments, the number of the contact plugs CP connected to the stack structure ST may be equal to the number of the electrodes EL included in the stack structure ST. The contact plugs CP may be spaced apart from each other and may be arranged in the second direction D2. Since the electrodes EL has the stair structure on the connection region CTR, bottom surfaces of the contact plugs CP may be disposed at different heights (or levels) from the substrate 100. The levels of the bottom surfaces of the contact plugs CP from the substrate 100 may decrease sequentially as a horizontal distance from the cell array region CAR increases.

A filling insulation layer 110 may be disposed on the stack structure ST of the connection region CTR. A vertical thickness of the filling insulation layer 110 may increase as a horizontal distance from the cell array region CAR increases. A top surface of the filling insulation layer 110 may be substantially coplanar with the top surface of the third insulating layer IL3 of the upper structure SS2.

A plurality of vertical dummy structures DS may penetrate the filling insulation layer 110 and the stack structure ST on the connection region CTR. The vertical dummy structures DS may be disposed in dummy holes DH, respectively. The vertical dummy structures DS may be disposed on the connection region CTR but might not be disposed on the cell array region CAR. The vertical dummy structures DS may be adjacent to the contact plugs CP but may be spaced apart from the contact plugs CP.

The vertical dummy structures DS may physically support the stack structure ST on the connection region CTR. A diameter of the vertical dummy structure DS may become progressively smaller toward the substrate 100. The diameter of the vertical dummy structure DS may become steadily smaller from the upper structure SS2 to the lower structure SS. For example, unlike the vertical channel structure VS described above, the diameter of the vertical dummy structure DS might not be abruptly changed. A sidewall of the vertical dummy structure DS may have a continuous profile. For example, the sidewall of the vertical dummy structure DS might not have a stepped profile, unlike the vertical channel structure VS. The sidewall of the vertical dummy structure DS may have a flat or planar profile.

In exemplary embodiments, the maximum diameter of the vertical dummy structure DS may be substantially equal to the maximum diameter of the vertical channel structure VS. In some exemplary embodiments, the maximum diameter of the vertical dummy structure DS may be greater than the maximum diameter of the vertical channel structure VS. The vertical dummy structures DS may include silicon oxide, silicon nitride, silicon oxynitride, or poly-silicon.

A first interlayer insulating layer 120 and a second interlayer insulating layer 130 may be sequentially stacked on the filling insulation layer 110. Bit lines BL may be disposed on the second interlayer insulating layer 130 and may extend in the first direction D1. The bit lines BL may be electrically connected to the vertical channel structures VS through the bit line contact plugs BPLG. Interconnection lines CL may be disposed on the second interlayer insulating layer 130 so as to be connected to the contact plugs CP.

FIGS. 6 to 17 are cross-sectional views taken along the line I-I' of FIG. 3 illustrating a method of manufacturing a 3D semiconductor memory device, according to exemplary embodiments of the inventive concepts.

Figure 6:
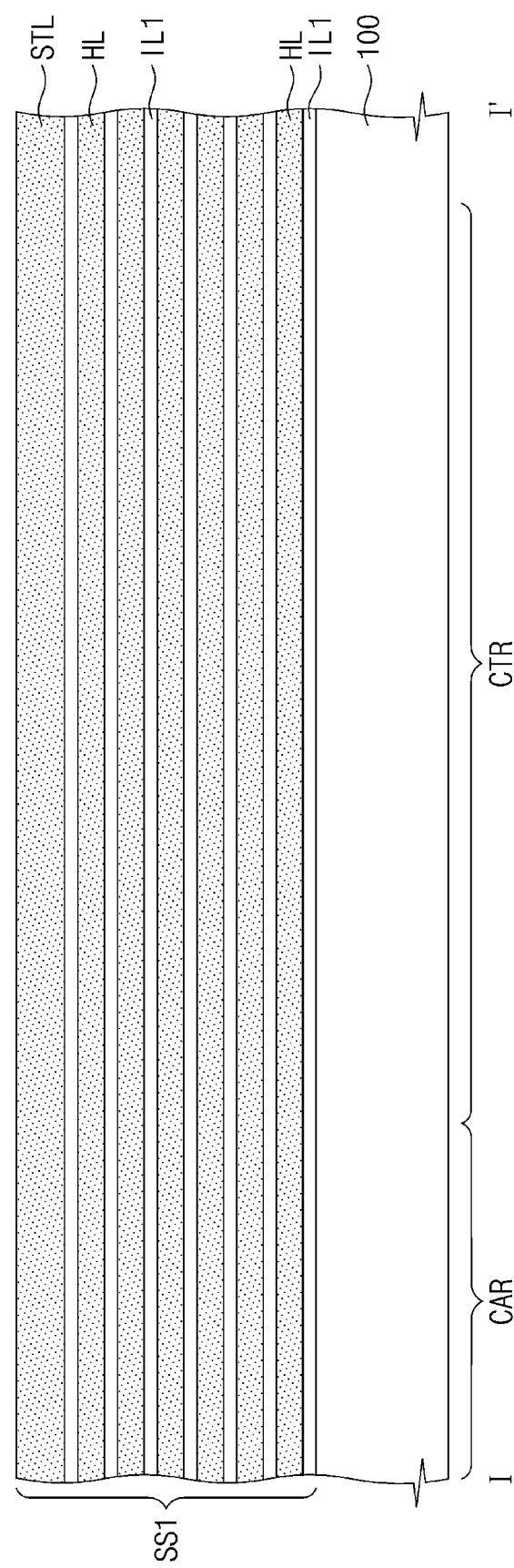
FIGS. 6 to 17 are cross-sectional views taken along the line I-I' of FIG. 3 illustrating a method of manufacturing a 3D semiconductor memory device, according to exemplary embodiments of the inventive concepts.

Referring to FIGS. 3 and 6, first insulating layers IL1 and sacrificial layers HL may be vertically and alternately stacked on an entire top surface of a substrate 100 to form a lower structure SS1. The substrate 100 may include a cell array region CAR and a connection region CTR. A stopper layer STL may be formed on the uppermost first insulating layer IL1. For example, the substrate 100 may be a silicon substrate, a germanium substrate, or a silicon-germanium substrate.

The first insulating layers IL1, the sacrificial layers HL and the stopper layer STL may be deposited using a thermal chemical vapor deposition (thermal CVD) process, a plasma-enhanced CVD process, a physical CVD process, and/or an atomic layer deposition (ALD) process. For example, each of the first insulating layers IL1 may be formed of a silicon oxide layer, and each of the sacrificial layers HL may be formed of a silicon nitride layer or a silicon oxynitride layer. The stopper layer STL may be formed of a silicon nitride layer or a silicon oxynitride layer. The stopper layer STL may be thicker than the sacrificial layer HL.

Figure 7:
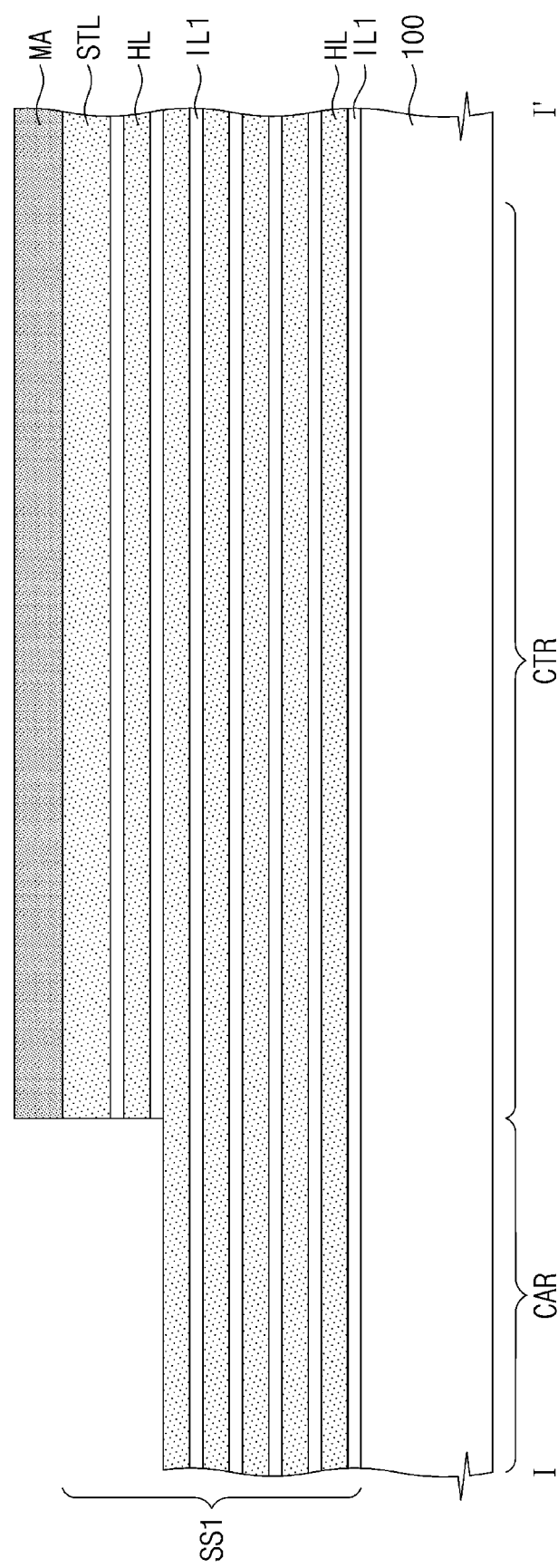

Referring to FIGS. 3 and 7, a mask layer MA may be formed on the connection region CTR. The mask layer MA may expose the cell array region CAR. The mask layer MA may include a photoresist pattern formed through a photolithography process.

The lower structure SS1 on the cell array region CAR may be partially etched using the mask layer MA as an etch mask. At least one sacrificial layer HL on the cell array region CAR may be removed during the etching process.

Figure 8:
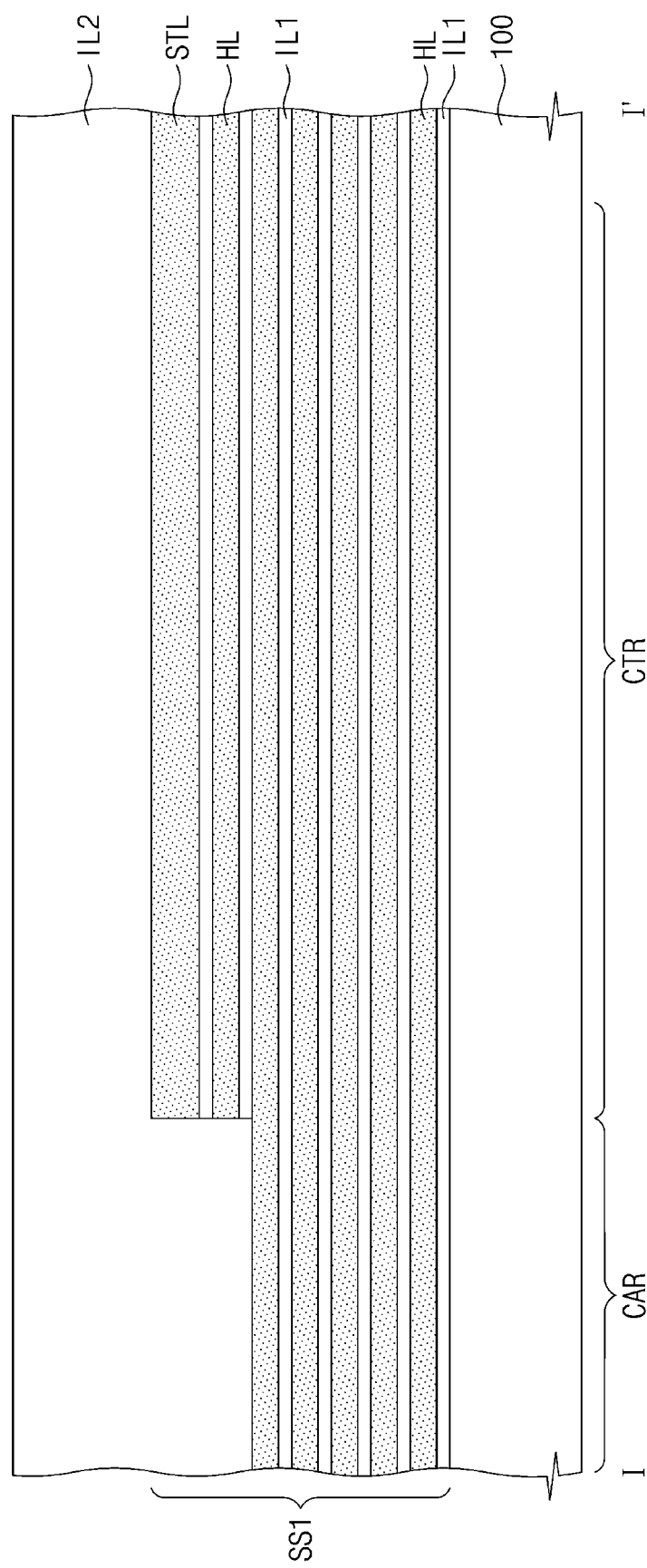

Referring to FIGS. 3 and 8, the mask layer MA may be selectively removed. A second insulating layer IL2 may be formed on the lower structure SS1. For example, the second insulating layer IL2 may be formed of a silicon oxide layer.

Figure 9:
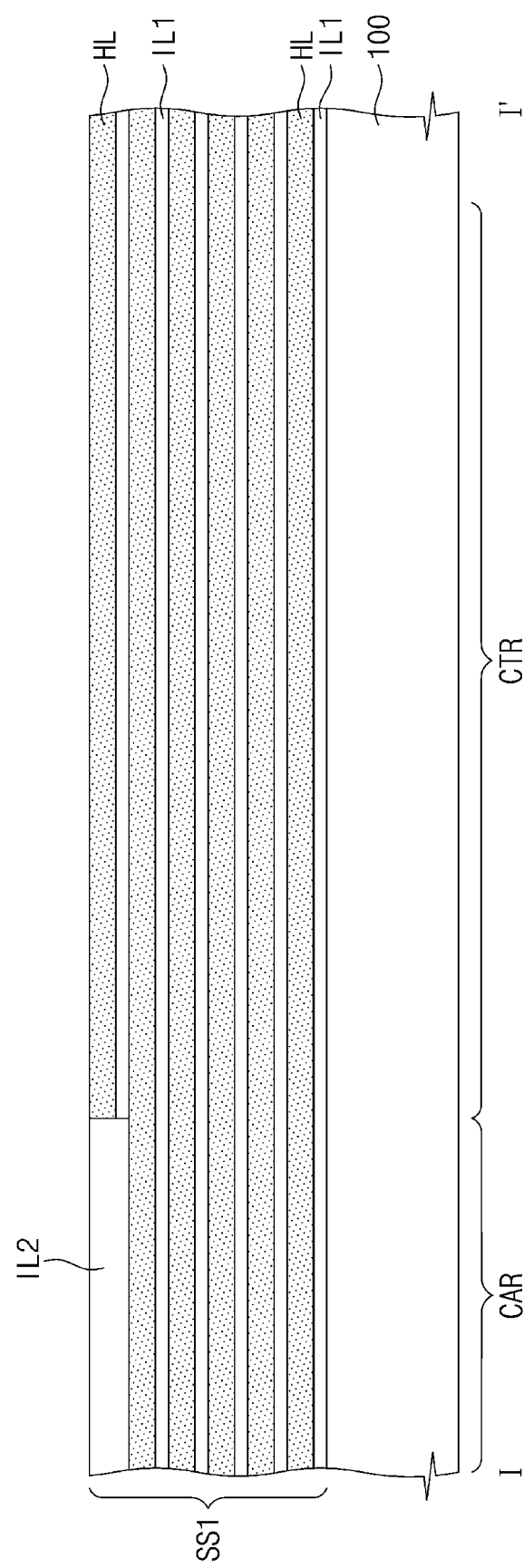

Referring to FIGS. 3 and 9, a first planarization process may be performed on the second insulating layer IL2 until a top surface of the stopper layer STL is exposed. The exposed stopper layer STL may be selectively removed.

A second planarization process may be performed until a top surface of the uppermost sacrificial layer HL of the lower structure SS1 is exposed. Thus, the top surface of the uppermost sacrificial layer HL of the lower structure SS1 may be substantially coplanar with a top surface of the second insulating layer IL2.

Figure 10:
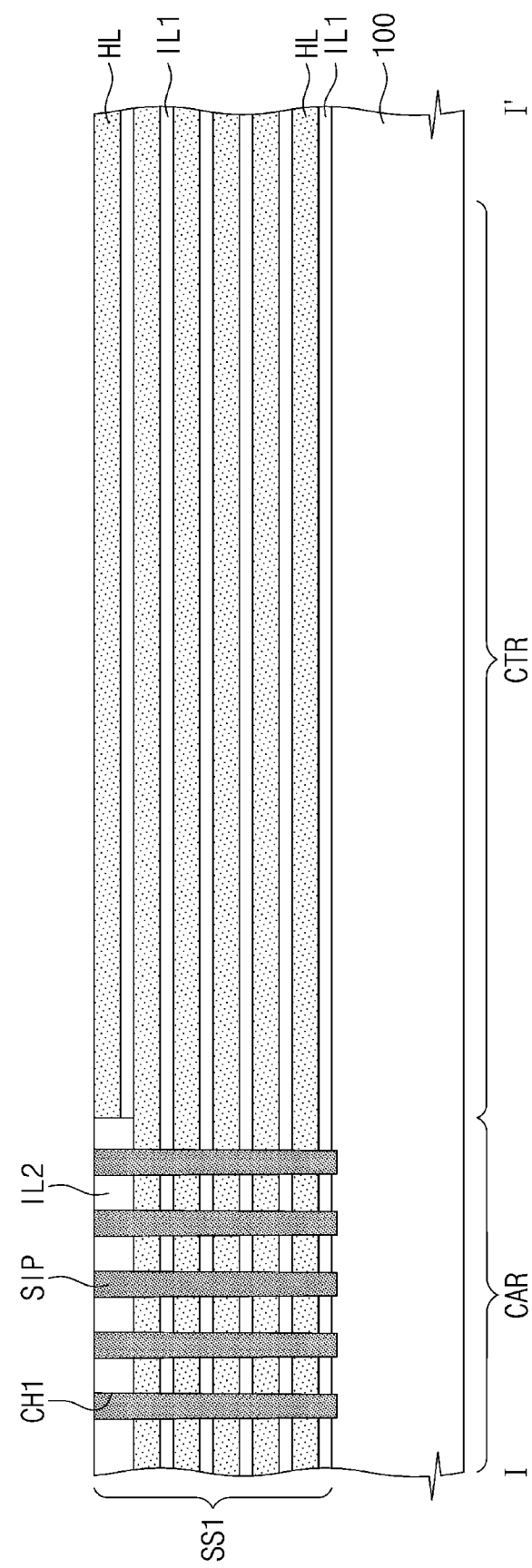

Referring to FIGS. 3 and 10, first channel holes CH1 may be formed to penetrate the lower structure SS1 on the cell array region CAR. The first channel holes CH1 may expose the substrate 100. A diameter of the first channel hole CH1 may become progressively smaller toward the substrate 100.

For example, the formation of the first channel holes CH1 may include forming a mask pattern having openings defining the first channel holes CH1 on the lower structure SS1, and etching the lower structure SS1 using the mask pattern as an etch mask. Thereafter, the mask pattern may be removed. A top surface of the substrate 100 under the first channel holes CH1 may be over-etched during the etching process. Thus, an upper portion of the substrate 100 under the first channel holes CH1 may be recessed. Sacrificial insulating patterns SIP may be formed to fill the first channel holes CH1, respectively.

Figure 11:
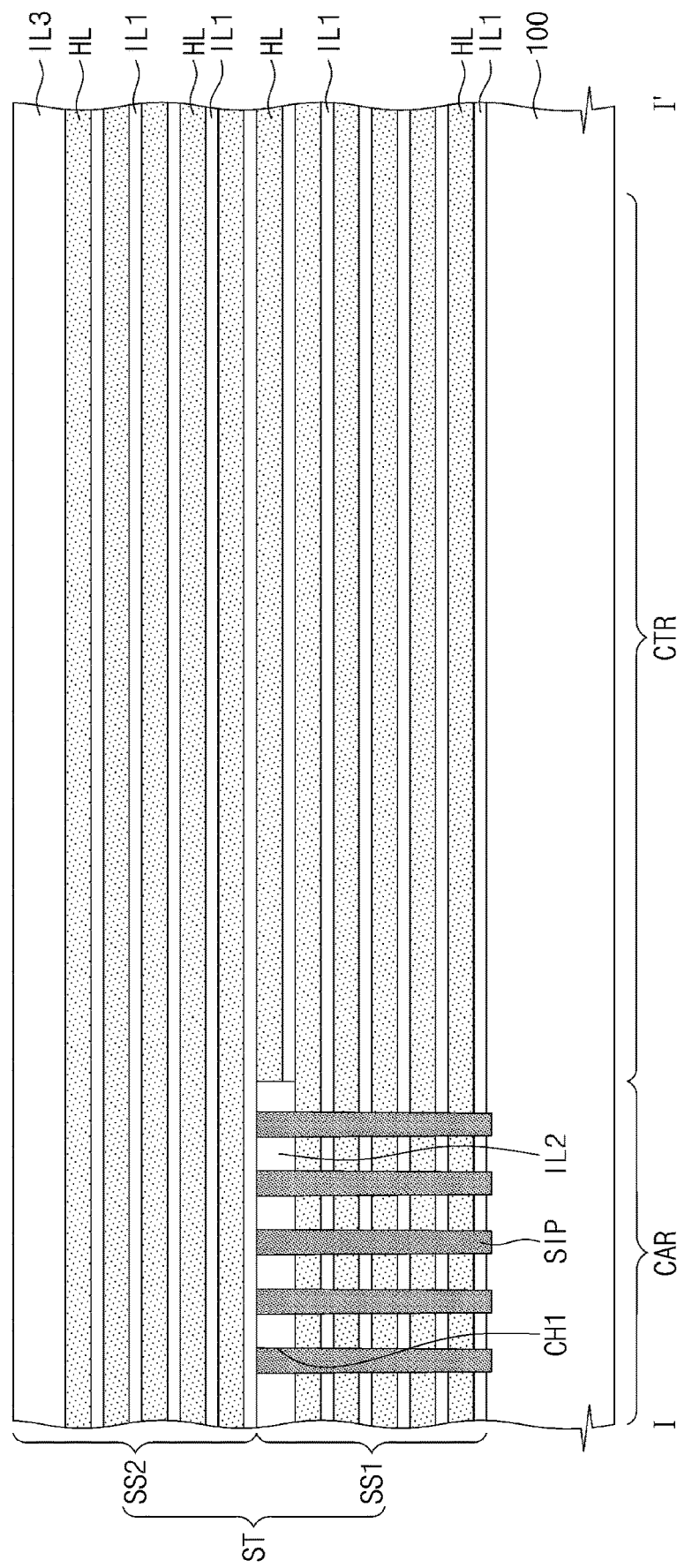

Referring to FIGS. 3 and 11, first insulating layers IL1 and sacrificial layers HL may be vertically and alternately stacked on the lower structure SS1 to form an upper structure SS2. The lower structure SS1 and the upper structure SS2 may constitute a stack structure ST. The formation of the first insulating layers IL1 and the sacrificial layers HL of the upper structure SS2 may be substantially the same as described above in the lower structure SS1. A third insulating layer IL3 may be formed on the uppermost sacrificial layer HL of the upper structure SS2.

Figure 12:
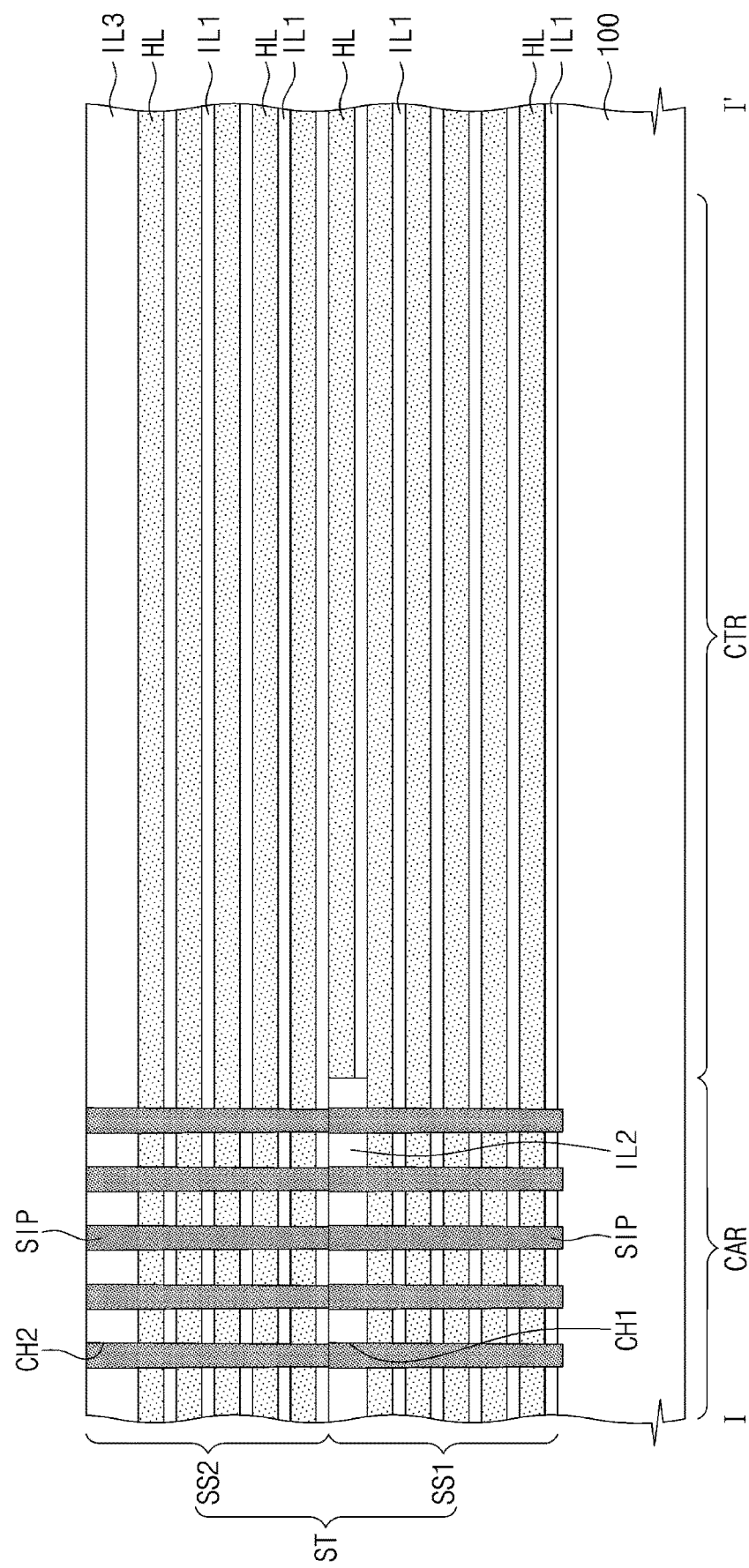

Referring to FIGS. 3 and 12, second channel holes CH2 may be formed to penetrate the upper structure SS2 on the cell array region CAR. The second channel holes CH2 may expose the sacrificial insulating patterns SIP. The second channel holes CH2 may vertically overlap with the first channel holes CH1, respectively, in a cross-sectional view. A diameter of the second channel hole CH2 may become progressively smaller toward the substrate 100. In exemplary embodiments, the second channel holes CH2 may be misaligned with the first channel holes CH1 when the second channel holes CH2 are formed. In this case, the second insulating layer IL2 may prevent the sacrificial layer HL disposed thereunder from being etched.

A method of forming the second channel holes CH2 may be substantially the same as the method of forming the first channel holes CH1. Sacrificial insulating patterns SIP may be formed to fill the second channel holes CH2, respectively.

Figure 13:
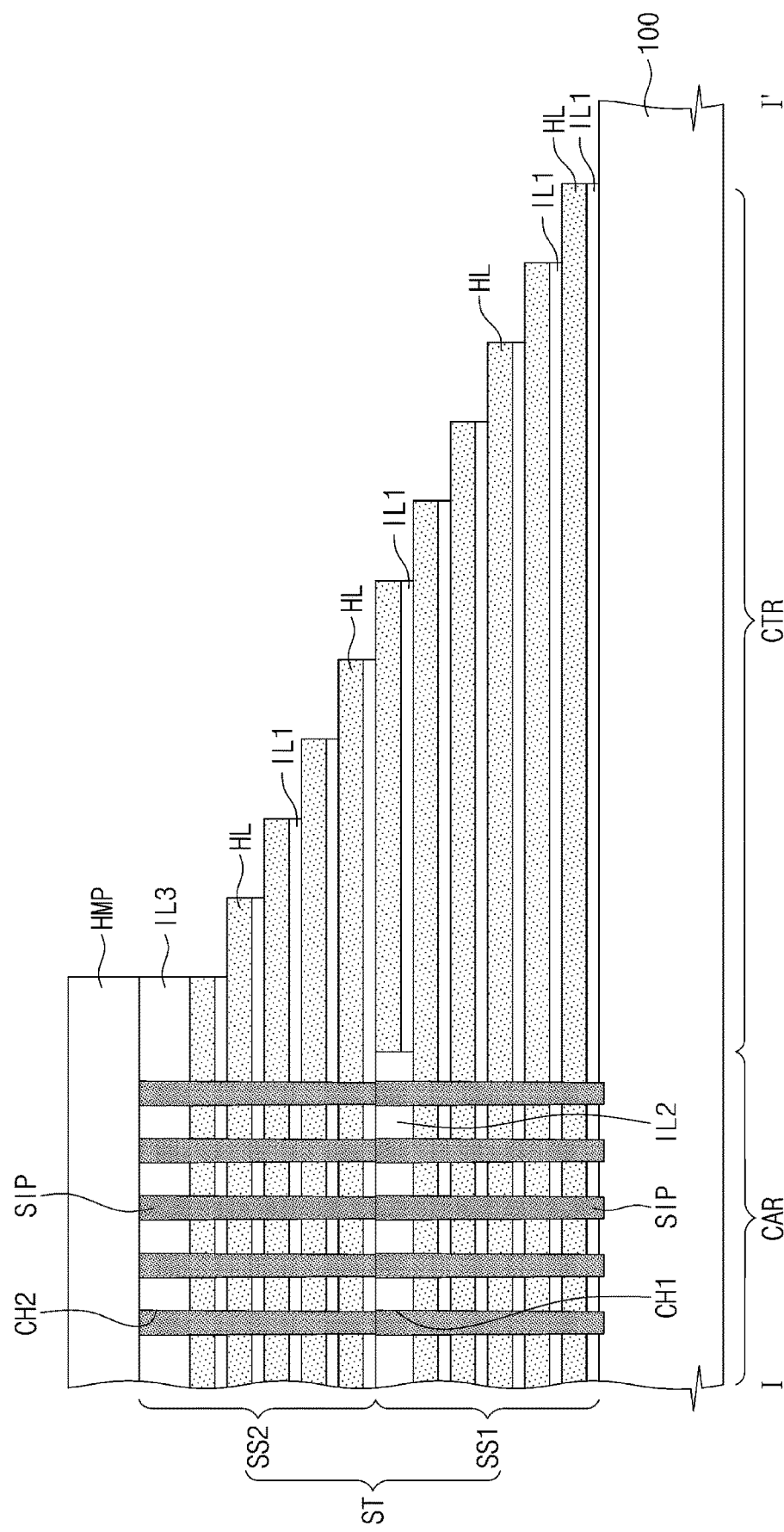

Referring to FIGS. 3 and 13, the stack structure ST on the connection region CTR may be formed into a stair structure. For example, a hard mask pattern HMP may be formed on the stack structure ST. The hard mask pattern HMP may expose a portion of the stack structure ST on the connection region CTR.

A process cycle using the hard mask pattern HMP may be repeatedly performed a plurality of times to form the stair structure on the connection region CTR. The process cycle may include a process of etching a portion of the stack structure ST using the hard mask pattern HMP as an etch mask, and a trimming process of reducing the hard mask pattern HMP. A plurality of the sacrificial layers HL exposed by the hard mask pattern HMP may be etched by the process of etching the portion of the stack structure ST. An etching depth in the etching process may correspond to a vertical pitch of the sacrificial layers HL vertically stacked. A sidewall of the hard mask pattern HMP may be laterally shifted by a specific distance during the trimming process, and thus an area of the hard mask pattern HMP may be reduced.

According to exemplary embodiments of the inventive concepts, thicknesses of the sacrificial layers HL on the connection region CTR may be substantially equal to each other. Thicknesses of the first insulating layers IL1 on the connection region CTR may be substantially equal to each other. For example, the sacrificial layers HL and the first insulating layers IL1 on the connection region CTR may be alternately stacked at equal vertical intervals. Thus, the etching depth in each of the etching processes repeatedly performed may be constantly maintained. As a result, the stair structure on the connection region CTR may be formed without a defect.

If the sacrificial layer HL having a different thickness and/or the first insulating layer IL1 having a different thickness exists on the connection region CTR, the sacrificial layer HL of the different thickness and/or the first insulating layer IL1 of the different thickness might not be completely etched or may be over-etched in the etching process. In this case, a stair structure having a structural defect may be formed on the connection region CTR.

Figure 14:
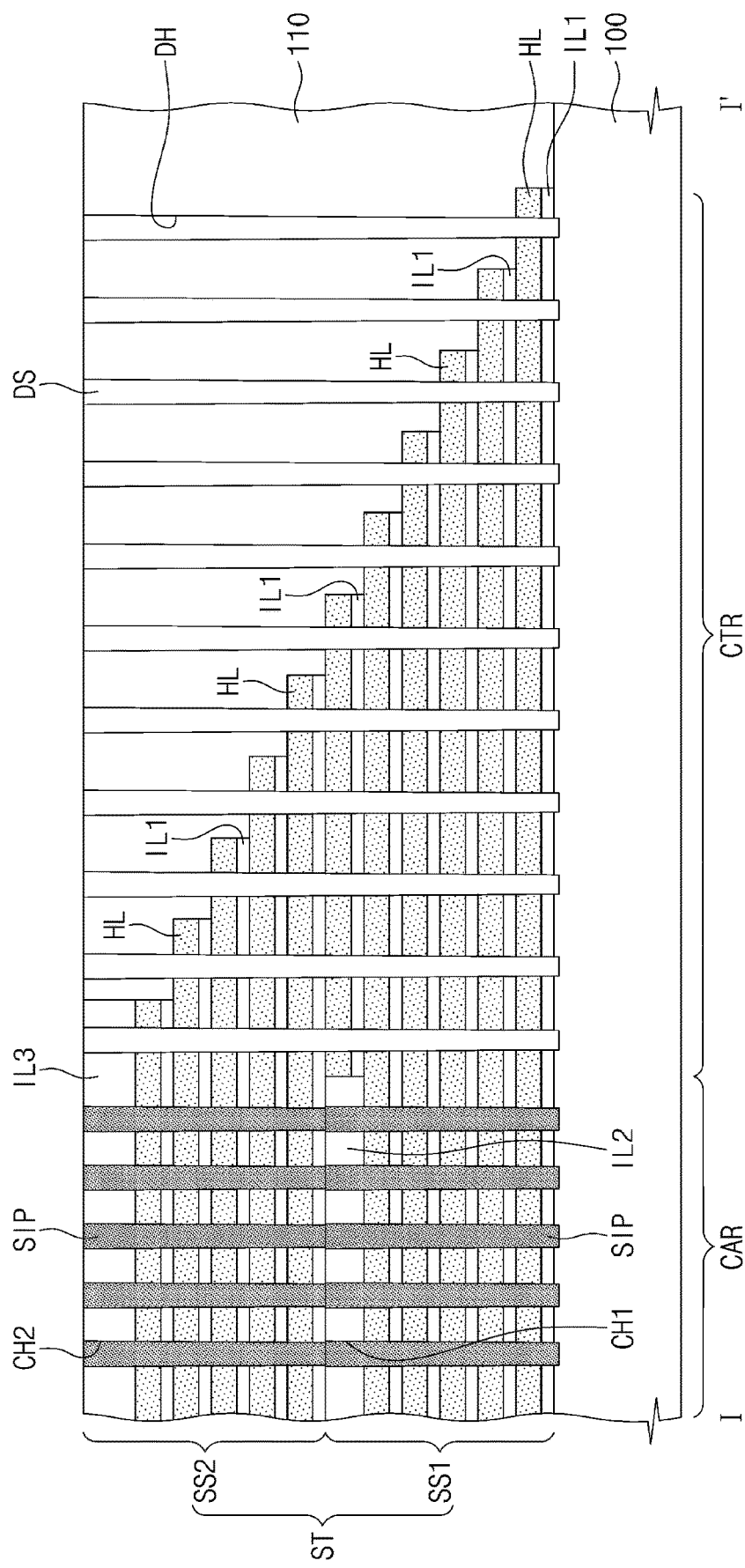

Referring to FIGS. 3 and 14, the hard mask pattern HMP may be selectively removed. A filling insulation layer 110 may be formed on the substrate 100 to cover the stack structure ST. A planarization process may be performed on the filling insulation layer 110 until a top surface of the third insulating layer IL3 is exposed.

A plurality of dummy holes DH may be formed to penetrate the filling insulation layer 110 and the stack structure ST on the connection region CTR. A diameter of each of the dummy holes DH may become progressively smaller toward the substrate 100. A method of forming the dummy holes DH may be substantially similar to the method of forming the first channel holes CH1 or the second channel holes CH2.

Vertical dummy structures DS may be formed to fill the dummy holes DH, respectively. For example, the vertical dummy structures DS may be formed of silicon oxide, silicon nitride, silicon oxynitride, or poly-silicon.

Figure 15:
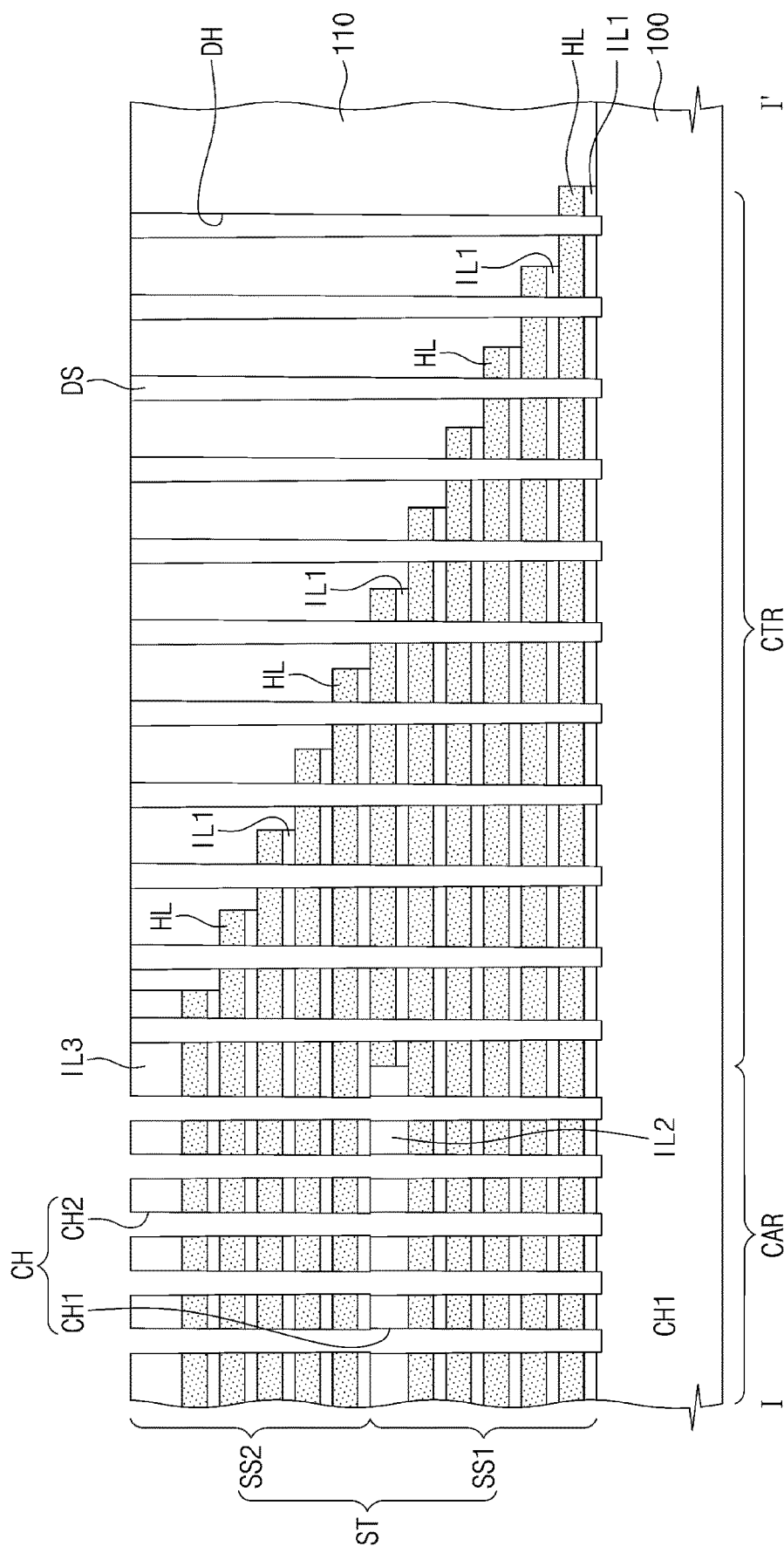

Referring to FIGS. 3 and 15, the sacrificial insulating patterns SIP filling the first and second channel holes CH1 and CH2 may be selectively removed. Thus, the second channel hole CH2 may be connected to the first channel hole CH1 to constitute a channel hole CH. Since the first channel hole CH1 and the second channel hole CH2 are formed by different processes, a diameter of the channel hole CH may be abruptly changed. For example, the diameter of the channel hole CH may increase abruptly (sharply) at an interface between the lower structure SS1 and the upper structure SS2. For example, an inner sidewall of the channel hole CH may have a stepped profile.

Figure 16:
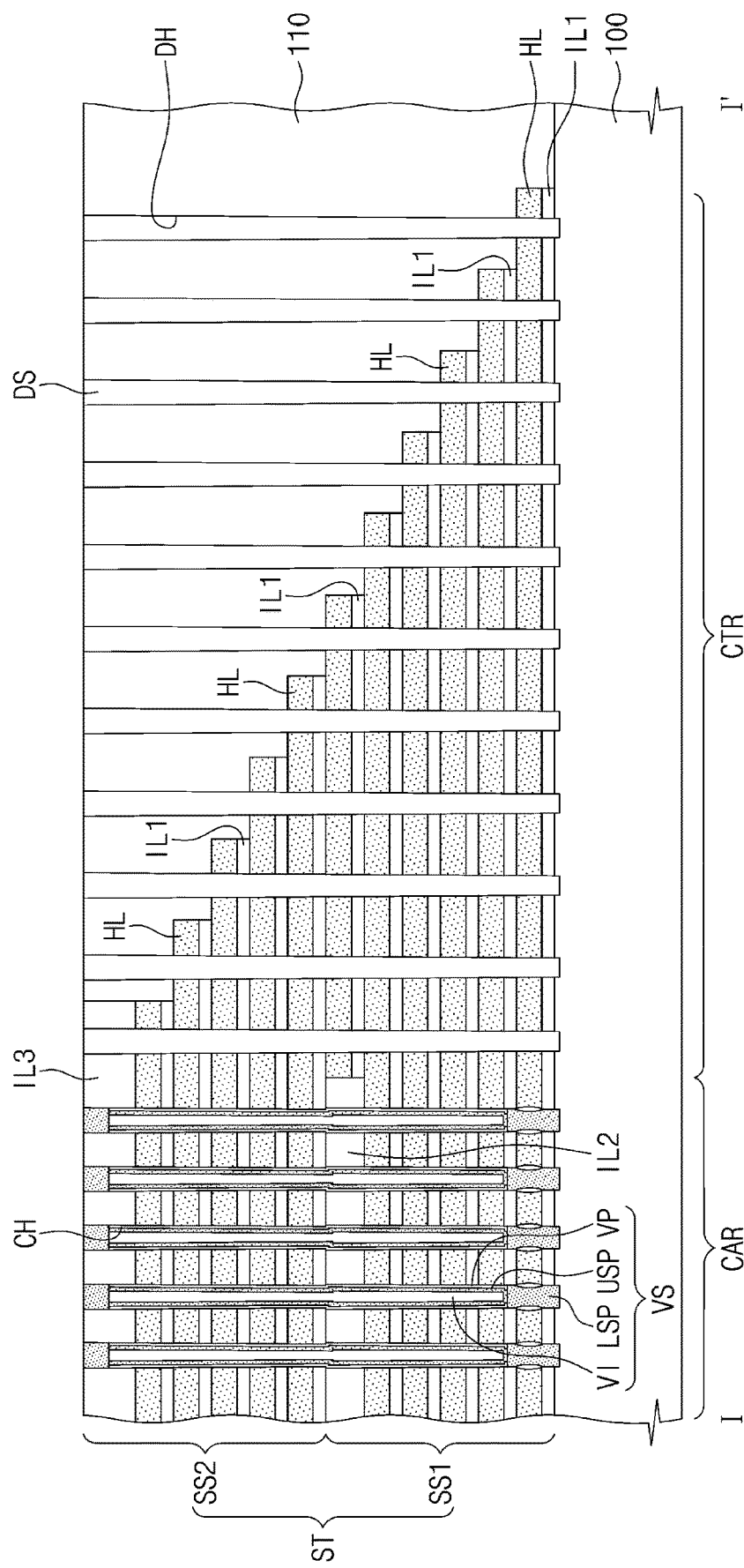

Referring to FIGS. 3 and 16, vertical channel structures VS may be formed in the channel holes CH, respectively. For example, lower semiconductor patterns LSP may be formed on the substrate 100 exposed through the channel holes CH. The lower semiconductor patterns LSP may fill lower regions of the channel holes CH, respectively. The lower semiconductor patterns LSP may be formed by a selective epitaxial growth (SEG) process using the substrate 100 exposed through the channel holes CH as a seed layer.

A vertical insulating layer VP and an upper semiconductor pattern USP may be formed to sequentially cover an inner sidewall of each of the channel holes CH. Each of the vertical insulating layer VP and the upper semiconductor pattern USP may be formed using an ALD process or a CVD process. Subsequently, a filling insulation pattern VI may be formed to fill each of the channel holes CH. A conductive pad PA may be formed in an upper region of each of the channel holes CH.

Figure 17:
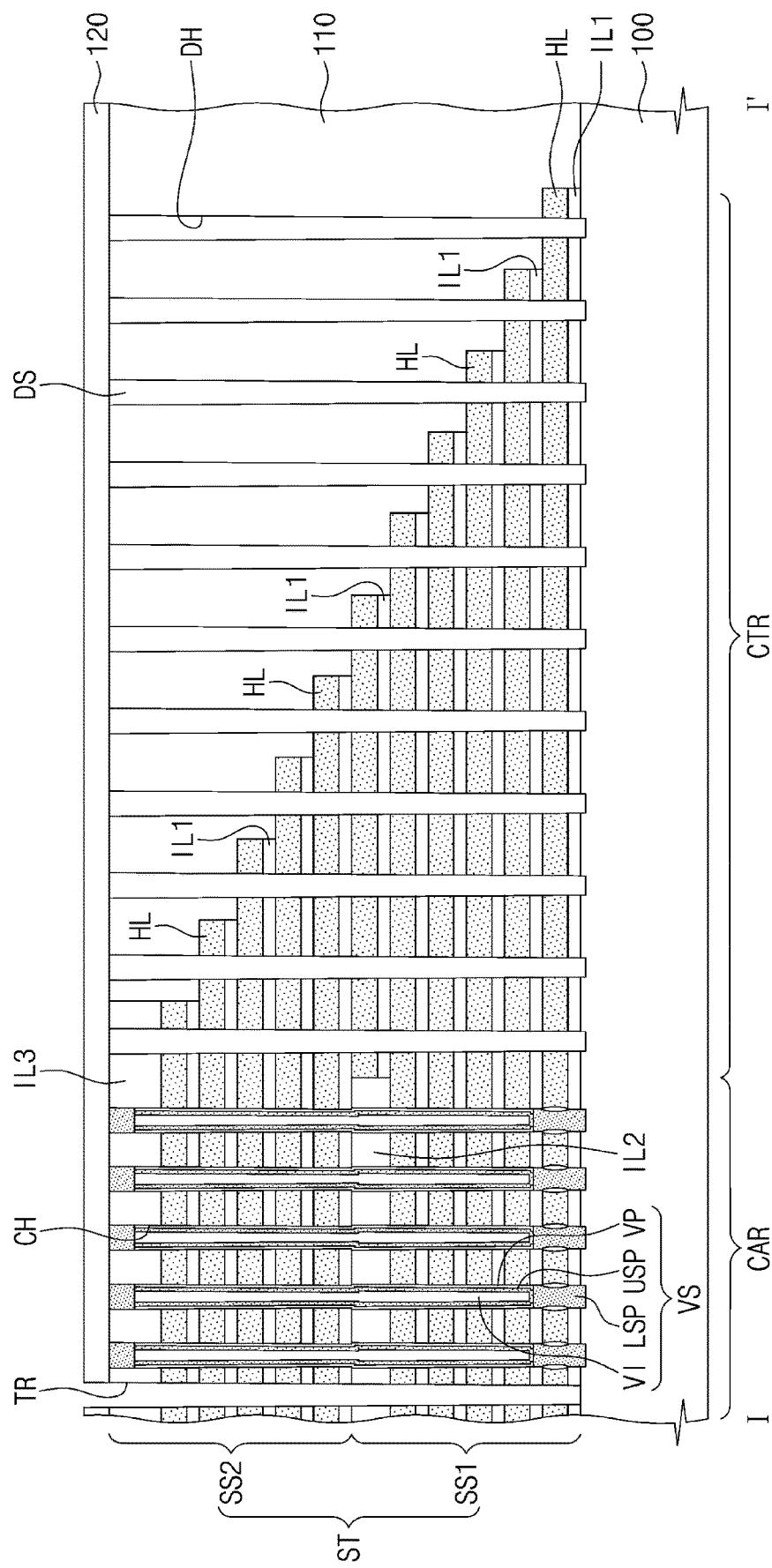

Referring to FIGS. 3 and 17, a first interlayer insulating layer 120 may be formed on the filling insulation layer 110. The stack structure ST may be patterned to form trenches TR penetrating the stack structure ST. The trenches TR may expose portions of the substrate 100. The trenches TR may extend in the second direction D2.

Referring again to FIGS. 3, 4A and 4B, the sacrificial layers HL may be replaced with electrodes EL, respectively. For example, the sacrificial layers HL exposed through the trenches TR may be selectively removed. A horizontal insulating layer HP and the electrode EL may be sequentially formed in each of spaces formed by the removal of the sacrificial layers HL.

Dopants may be implanted into the substrate 100 exposed through the trenches TR to form common source regions CSR. Insulating spacers SP and a common source plug CSP may be formed in each of the trenches TR. The common source plug CSP may be connected to the common source region CSR.

A second interlayer insulating layer 130 may be formed on the first interlayer insulating layer 120. Bit line contact plugs BPLG may be formed to penetrate the second and first interlayer insulating layers 130 and 120. The bit line contact plugs BPLG may be electrically connected to the vertical channel structures VS, respectively. Contact plugs CP may be formed to penetrate the second and first interlayer insulating layers 130 and 120 and the filling insulation layer 110. The contact plugs CP may be connected to the electrodes EL on the connection region CTR. Bit lines BL and interconnection lines CL may be formed on the second interlayer insulating layer 130. The bit lines BL may be electrically connected to the bit line contact plugs BPLG, and the interconnection lines CL may be electrically connected to the contact plugs CP.

In the manufacturing method according to exemplary embodiments of the inventive concepts, the lower structure SS1 and the first channel holes CH1 may be formed, and then, the upper structure SS2 and the second channel holes CH2 may be formed. The first channel hole CH1 may be connected to the second channel hole CH2, and thus one channel hole CH may completely penetrate the stack structure having a great height (e.g. a stack structure of many levels, such as is shown in the figures). Thus, an integration density and reliability of the 3D semiconductor memory device may be increased.

In the manufacturing method according to exemplary embodiments of the inventive concepts, the second insulating layer IL2 may be selectively formed on the cell array region CAR, and thus it is possible to prevent a process defect which may occur when the second channel hole CH2 is misaligned with the first channel hole CH1.

Meanwhile, the second insulating layer IL2 might not be formed on the connection region CTR. The sacrificial layers HL and the first insulating layers IL1 on the connection region CTR may be alternately stacked at equal vertical intervals, and thus the stair structure may be formed on the connection region CTR without a defect.

Figure 18:
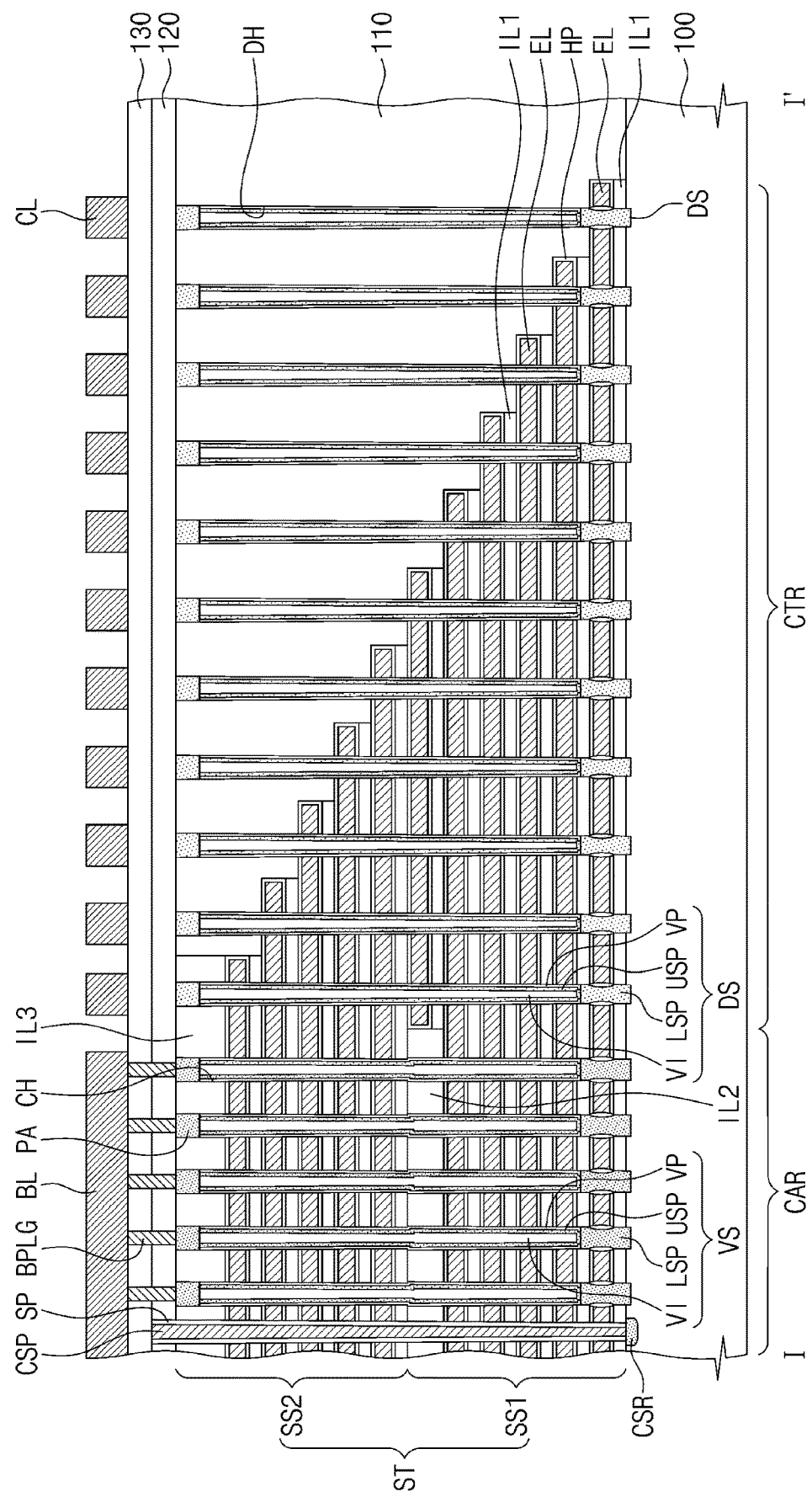
FIG. 18 is a cross-sectional view taken along the line I-I' of FIG. 3 illustrating a 3D semiconductor memory device according to exemplary embodiments of the inventive concepts.

FIG. 18 is a cross-sectional view taken along the line I-I' of FIG. 3 illustrating a 3D semiconductor memory device according to exemplary embodiments of the inventive concepts. In the present embodiment, the descriptions to the same technical features as in the embodiments of FIGS. 3, 4A, 4B, 5A and 5B will be omitted or mentioned briefly for the purpose of ease and convenience in explanation. For example, differences between the present embodiment and the embodiments of FIGS. 3, 4A, 4B, 5A and 5B will be mainly described hereinafter.

Referring to FIGS. 3 and 18, a vertical dummy structure DS on the connection region CTR may include substantially the same structure (or the same components) as the vertical channel structure VS. For example, each of the vertical dummy structures DS may include a vertical insulating layer VP, an upper semiconductor pattern USP, a lower semiconductor pattern LSP, and a filling insulation pattern VI. The vertical dummy structures DS may physically support the stack structure ST on the connection region CTR but might not be used as memory cells, unlike the vertical channel structures VS.

A method of forming the vertical dummy structures DS according to the present embodiment will be described. Channel holes CH and dummy holes DH which expose portions of the substrate 100 may be formed on the aforementioned resultant structure of FIG. 15. The vertical insulating layer VP, the upper semiconductor pattern USP, the lower semiconductor pattern LSP and the filling insulation pattern VI may be formed in each of the channel and dummy holes CH and DH.

Figure 19:
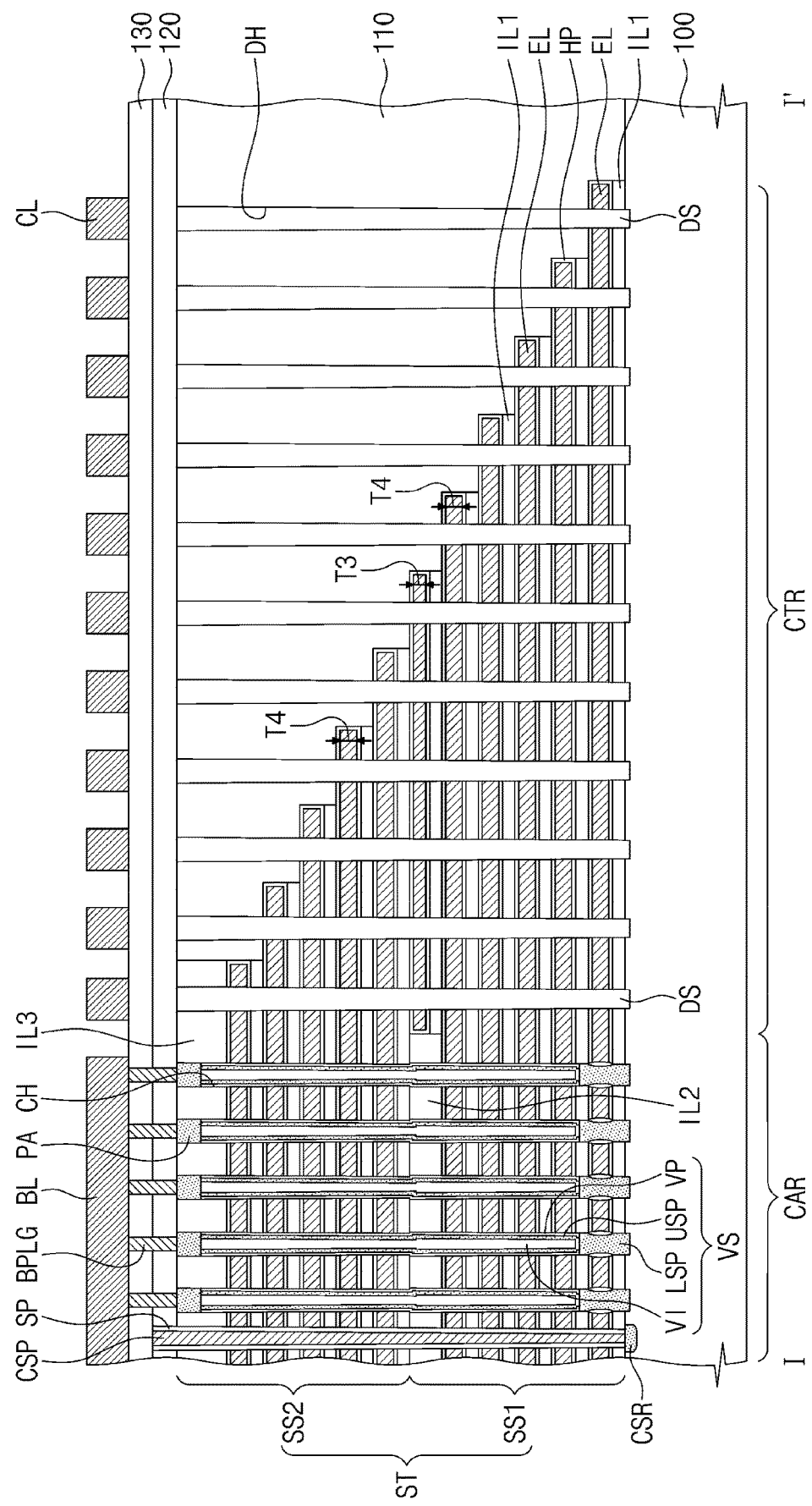
FIG. 19 is a cross-sectional view taken along the line I-I' of FIG. 3 illustrating a 3D semiconductor memory device according to exemplary embodiments of the inventive concepts.

FIG. 19 is a cross-sectional view taken along the line I-I' of FIG. 3 illustrating a 3D semiconductor memory device according to exemplary embodiments of the inventive concepts. It may be assumed that to the extent that a detailed description of certain elements is omitted, these elements may be at least similar to corresponding elements that have already been described. Thus, differences between the present embodiment and the embodiments of FIGS. 3, 4A, 4B, 5A and 5B will be mainly described hereinafter.

Referring to FIGS. 3 and 19, the uppermost electrode EL of the lower structure SS1 may have a third thickness T3. Each of other electrodes EL except the uppermost electrode EL of the lower structure SS1 may have a fourth thickness T4. The third thickness T3 may be different from the fourth thickness T4. For example, the third thickness T3 may be smaller than the fourth thickness T4.

Referring again to FIG. 9, the second planarization process may be performed until a top surface of the uppermost sacrificial layer HL of the lower structure SS1 is exposed. At this time, a thickness of the uppermost sacrificial layer HL of the lower structure SS1 may be reduced as compared with thicknesses of other sacrificial layers HL. As a result, the thickness T3 of the uppermost electrode EL of the lower structure SS1 may be smaller than the thicknesses T4 of the other electrodes EL.

Figure 20:
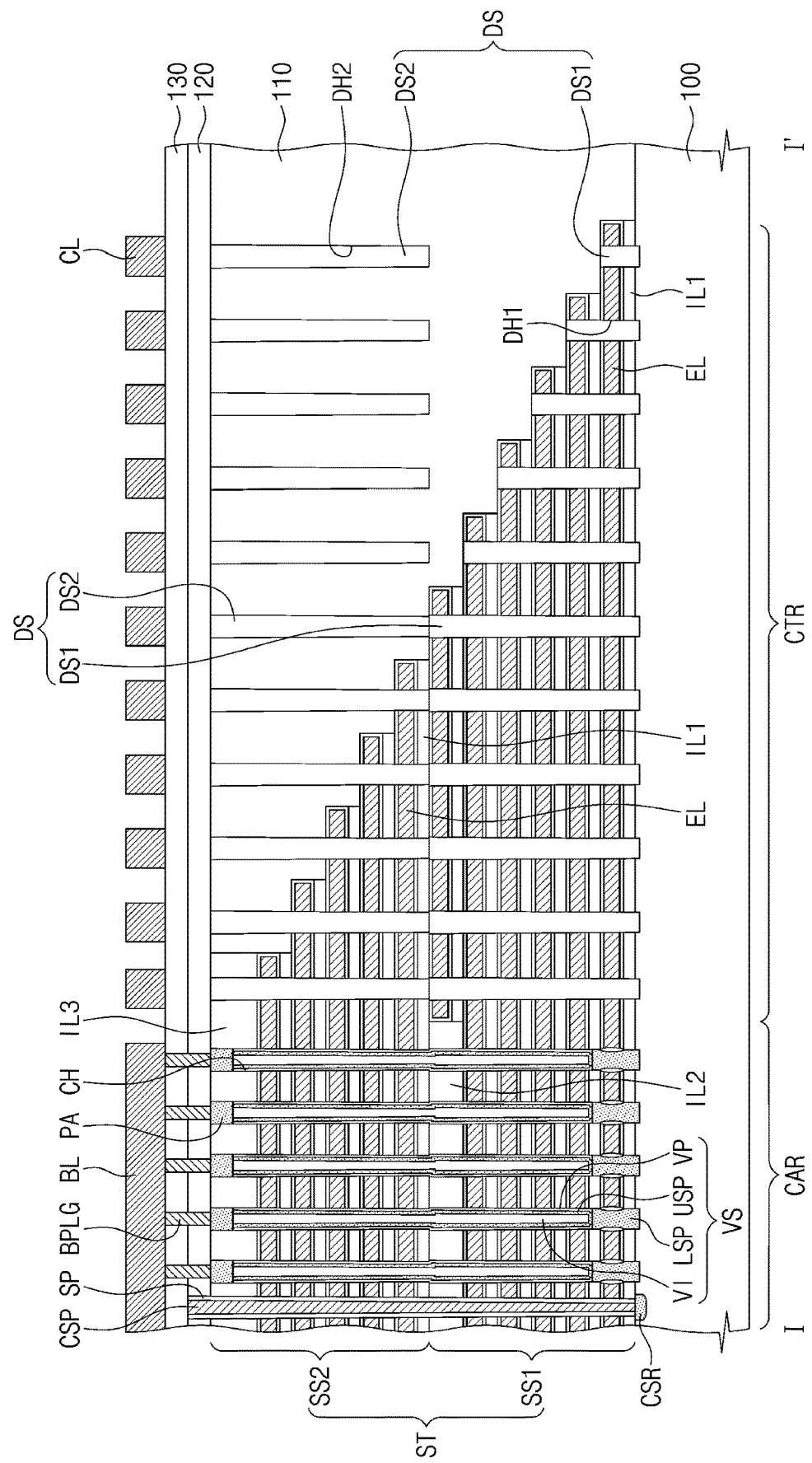
FIG. 20 is a cross-sectional view taken along the line I-I' of FIG. 3 illustrating a 3D semiconductor memory device according to exemplary embodiments of the inventive concepts.

FIG. 20 is a cross-sectional view taken along the line I-I' of FIG. 3 illustrating a 3D semiconductor memory device according to exemplary embodiments of the inventive concepts. It may be assumed that to the extent that a detailed description of certain elements is omitted, these elements may be at least similar to corresponding elements that have already been describe. Thus, differences between the present embodiment and the embodiments of FIGS. 3, 4A, 4B, 5A and 5B will be mainly described hereinafter.

Referring to FIGS. 3 and 20, each of vertical dummy structures DS may include a lower dummy structure DS1 and an upper dummy structure DS2 on the lower dummy structure DS1. The upper dummy structure DS2 may vertically overlap with the lower dummy structure DS1 in a cross-sectional view. Bottom surfaces of the upper dummy structures DS2 may be located at substantially the same level. The lower dummy structure DS1 and the upper dummy structure DS2 may include the same material or different materials. Each of the lower dummy structure DS1 and the upper dummy structure DS2 may include silicon oxide, silicon nitride, silicon oxynitride, and/or poly-silicon.

In exemplary embodiments, the vertical dummy structures DS may include a first vertical dummy structure DS and a second vertical dummy structure DS. The first vertical dummy structure DS may be disposed in a region where a top surface of the electrode EL is lower than a top surface of the second insulating layer IL2. The second vertical dummy structure DS may be closer to the cell array region CAR than the first vertical dummy structure DS. The second vertical dummy structure DS may be disposed in a region where a top surface of the electrode EL is located at the same level as or a higher level than the top surface of the second insulating layer IL2.

The upper dummy structure DS2 of the first vertical dummy structure DS may be vertically spaced apart from the lower dummy structure DS1 of the first vertical dummy structure DS. For example, the upper dummy structure DS2 may be vertically spaced apart from the lower dummy structure DS1 in the region where the top surface of the electrode EL is lower than the top surface of the second insulating layer IL2. A top surface of the lower dummy structure DS1 of the first vertical dummy structure DS may be lower than the top surface of the uppermost electrode EL of the lower structure SS1.

The upper dummy structure DS2 of the second vertical dummy structure DS may be in contact with the lower dummy structure DS1 of the second vertical dummy structure DS. For example, the upper dummy structure DS2 may be in contact with the lower dummy structure DS1 in the region where the top surface of the electrode EL is located at the same level as or a higher level than the top surface of the second insulating layer IL2. A diameter of the second vertical dummy structure DS may increase abruptly (sharply) between the lower dummy structure DS1 and the upper dummy structure DS2. For example, a sidewall of the second vertical dummy structure DS may have a stepped profile.

Figure 21:
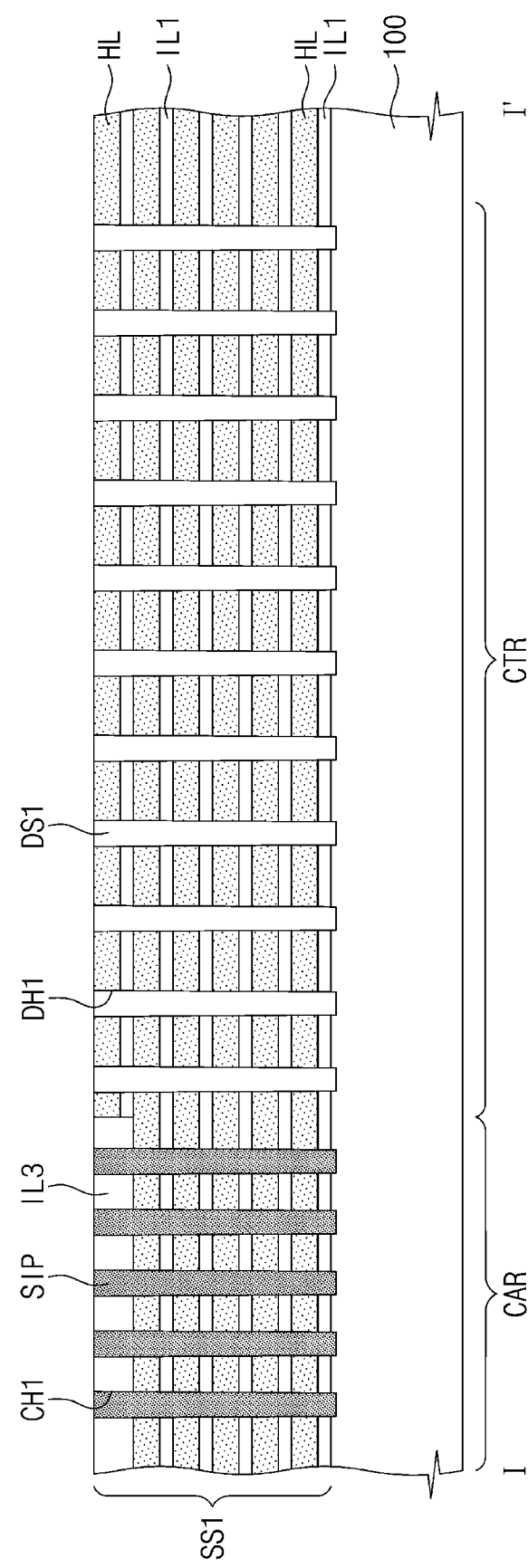
FIGS. 21 to 23 are cross-sectional views taken along the line I-I' of FIG. 3 illustrating a method of manufacturing the 3D semiconductor memory device of FIG. 20.
Figure 22:
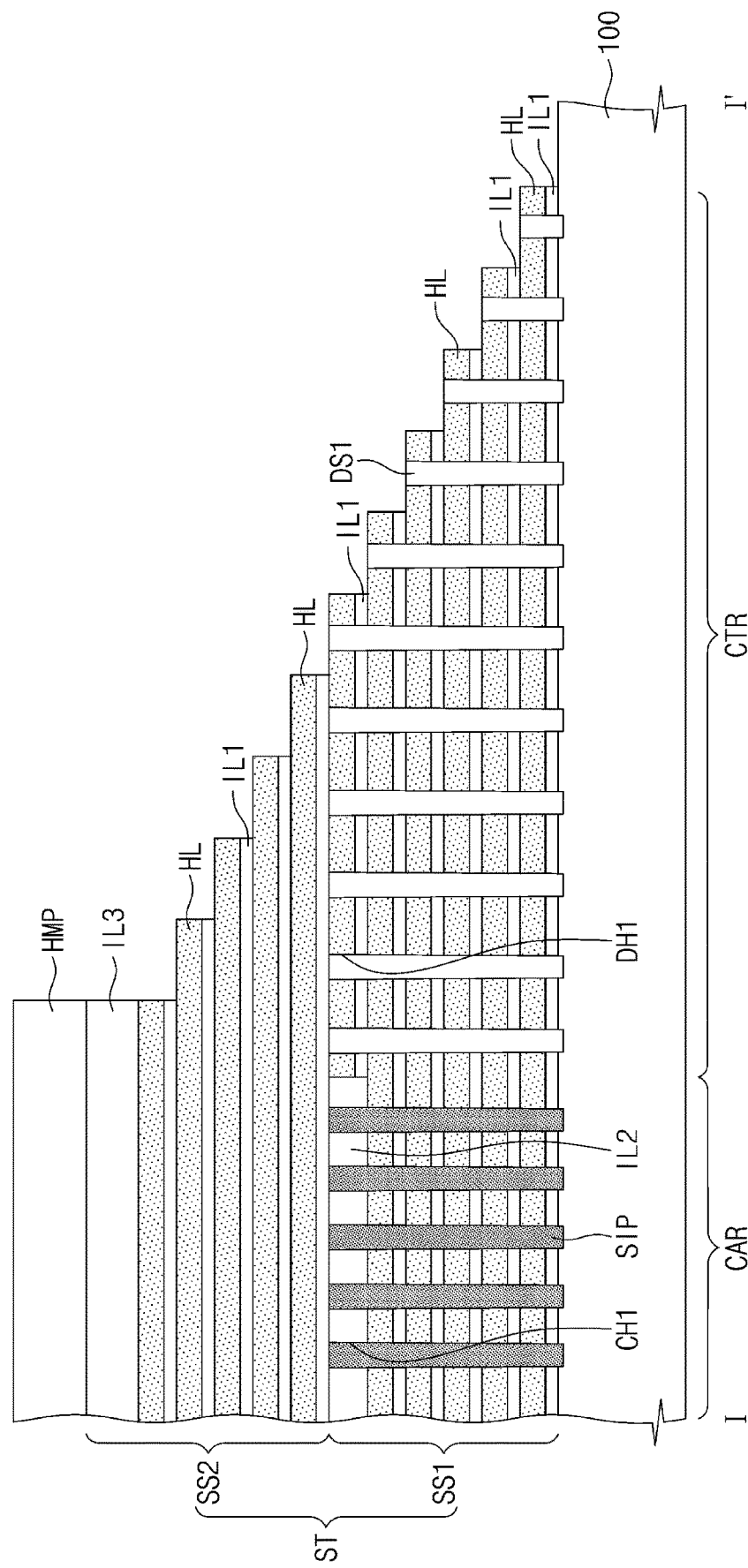
Figure 23:
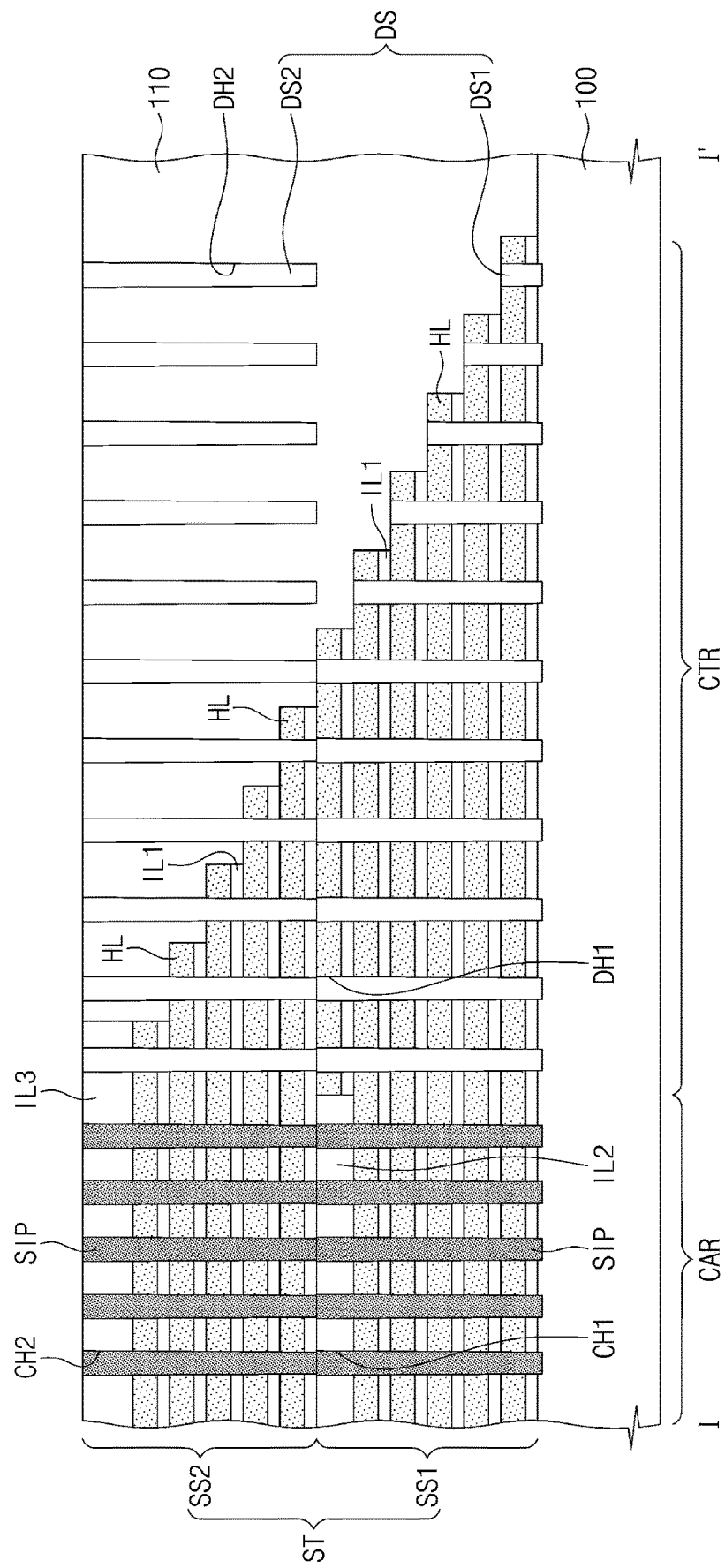

FIGS. 21 to 23 are cross-sectional views taken along the line I-I' of FIG. 3 illustrating a method of manufacturing the 3D semiconductor memory device of FIG. 20.

Referring to FIGS. 3 and 21, first channel holes CH1 and first dummy holes DH1 may be formed in the resultant structure of FIG. 9. The first channel hole CH1 and the first dummy hole DH1 may be formed at the same time or may be sequentially formed. A diameter of each of the first channel hole CH1 and the first dummy hole DH1 may become progressively smaller toward the substrate 100. Lower dummy structures DS1 may be formed to fill the first dummy holes DH1, respectively. For example, the lower dummy structures DS1 may be formed of silicon oxide.

Referring to FIGS. 3 and 22, an upper structure SS2 may be formed on the lower structure SS1. The stack structure ST on the connection region CTR may be formed into a stair structure. The formation of the stair structure may include repeatedly performing a process cycle using a hard mask pattern HMP a plurality of times. At least one lower dummy structure DS1 may be partially etched during the formation of the stair structure. The etched lower dummy structure(s) DS1 may form a portion of the stair structure.

Referring to FIGS. 3 and 23, second channel holes CH2 and second dummy holes DH2 may be formed. The second channel hole CH2 and the second dummy hole DH2 may be formed at the same time or may be sequentially formed. The second dummy holes DH2 may vertically overlap with the first dummy holes DH1, respectively, in a cross-sectional view. A diameter of each of the second channel hole CH2 and the second dummy hole DH2 may become progressively smaller toward the substrate 100. Upper dummy structures DS2 may be formed to fill the second dummy holes DH2, respectively. For example, the upper dummy structures DS2 may be formed of silicon oxide, silicon nitride, silicon oxynitride, or poly-silicon.

Subsequent processes may be substantially the same as or similar to corresponding processes described above with reference to FIGS. 15 to 17.

Figure 24:
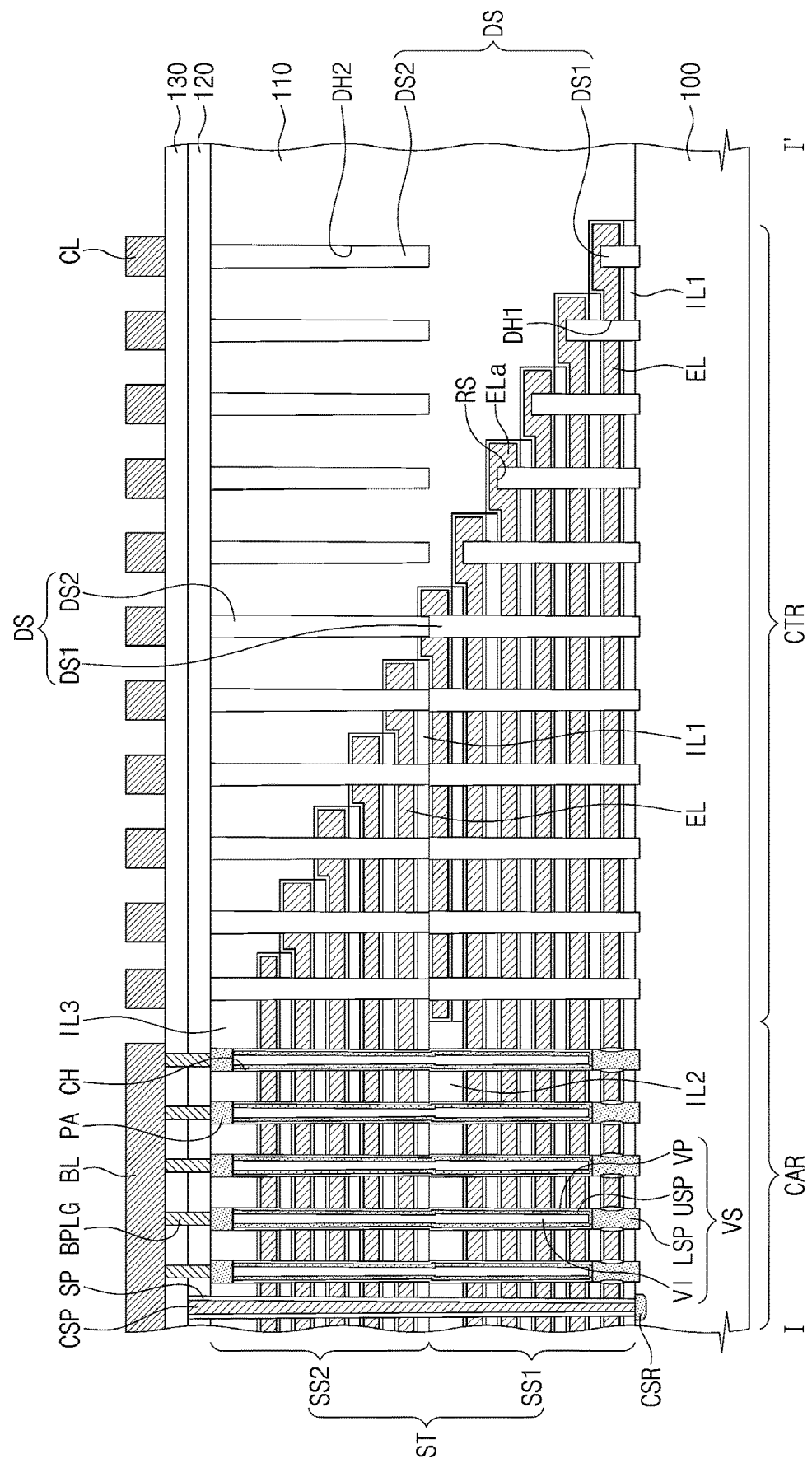
FIG. 24 is a cross-sectional view taken along the line I-I' of FIG. 3 illustrating a 3D semiconductor memory device according to exemplary embodiments of the inventive concepts.

FIG. 24 is a cross-sectional view taken along the line I-I' of FIG. 3 illustrating a 3D semiconductor memory device according to exemplary embodiments of the inventive concepts. It may be assumed that to the extent that a detailed description of certain elements is omitted, these elements may be at least similar to corresponding elements that have already been described. Thus, differences between the present embodiment and the embodiments of FIGS. 3 and 20 will be mainly described hereinafter.

Referring to FIGS. 3 and 24, each of electrodes EL on the connection region CTR may include an expansion ELa disposed at its one end. The expansion ELa may be thicker than the electrode EL disposed on the cell array region CAR. A recess RS may be defined in the expansion ELa by a lower dummy structure DS1 supporting the expansion ELa. The recess RS may extend from a bottom surface of the expansion ELa toward a top surface of the expansion ELa. An upper portion of the lower dummy structure DS1 may fill the recess RS.

Figure 25:
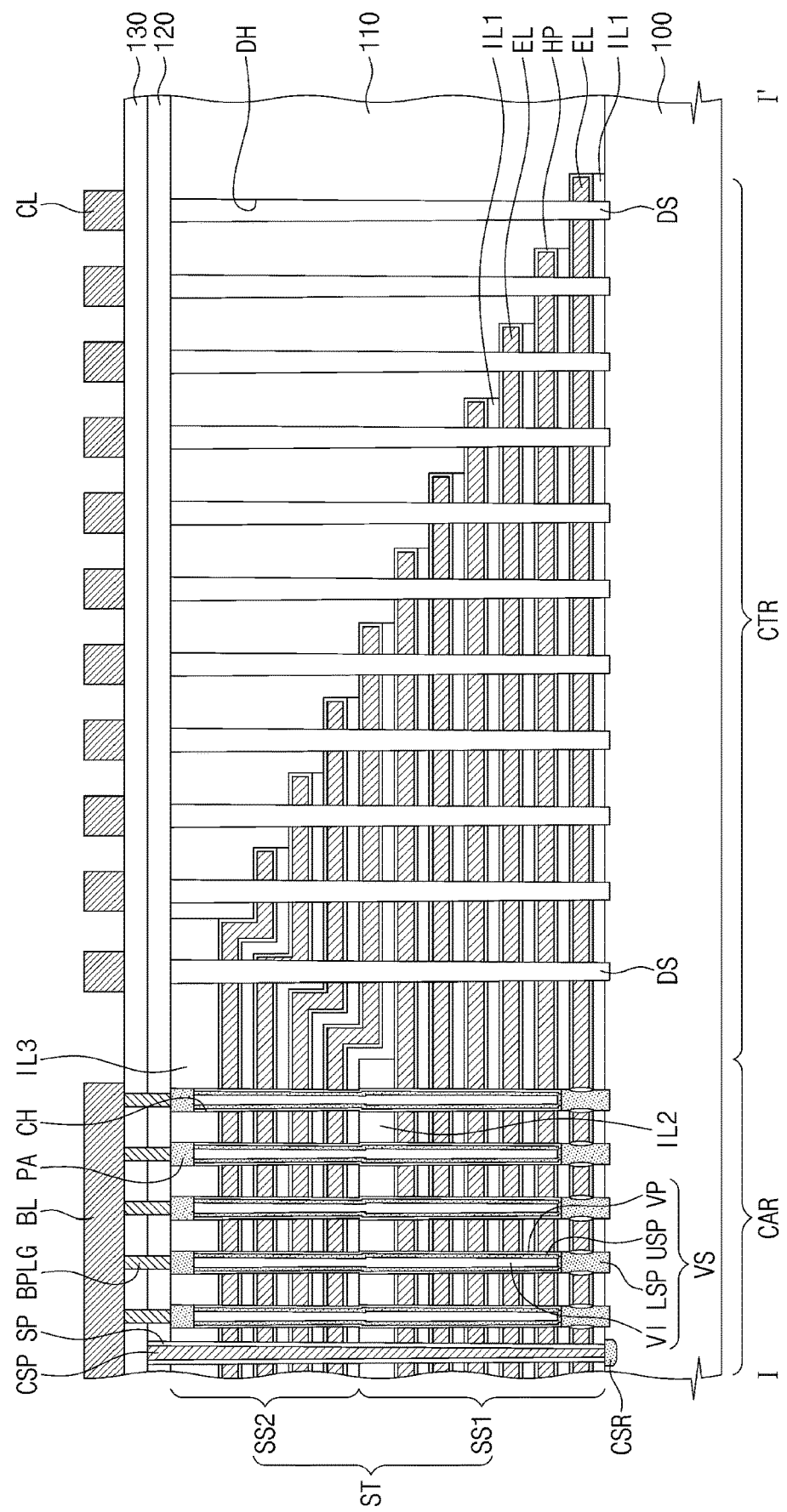
FIG. 25 is a cross-sectional view taken along the line I-I' of FIG. 3 illustrating a 3D semiconductor memory device according to exemplary embodiments of the inventive concepts.

FIG. 25 is a cross-sectional view taken along the line I-I' of FIG. 3 illustrating a 3D semiconductor memory device according to exemplary embodiments of the inventive concepts. It may be assumed that to the extent that a detailed description of certain elements is omitted, these elements may be at least similar to corresponding elements that have already been described. Thus, differences between the present embodiment and the embodiments of FIGS. 3, 4A, 4B, 5A and 5B will be mainly described hereinafter.

Referring to FIGS. 3 and 25, the number of electrodes EL of the stack structure ST on the cell array region CAR may be equal to the number of electrodes EL of the stack structure ST on the connection region CTR. The stack structure ST of the cell array region CAR may additionally include a second insulating layer IL2. The second insulating layer IL2 might not be disposed in the stack structure ST of the connection region CTR.

A level of the electrode EL of the upper structure SS2 of the cell array region CAR may be higher than a level of the electrode EL of the upper structure SS2 of the connection region CTR. The electrode EL of the upper structure SS2 may have a stepped structure while extending from the cell array region CAR onto the connection region CTR. For example, a bottom surface of the lowermost electrode EL of the upper structure SS2 of the cell array region CAR may be higher than a bottom surface of the lowermost electrode EL of the upper structure SS2 of the connection region CTR.

FIGS. 26 to 29 are cross-sectional views taken along the line I-I' of FIG. 3 illustrating a method of manufacturing the 3D semiconductor memory device of FIG. 25.

Figure 26:
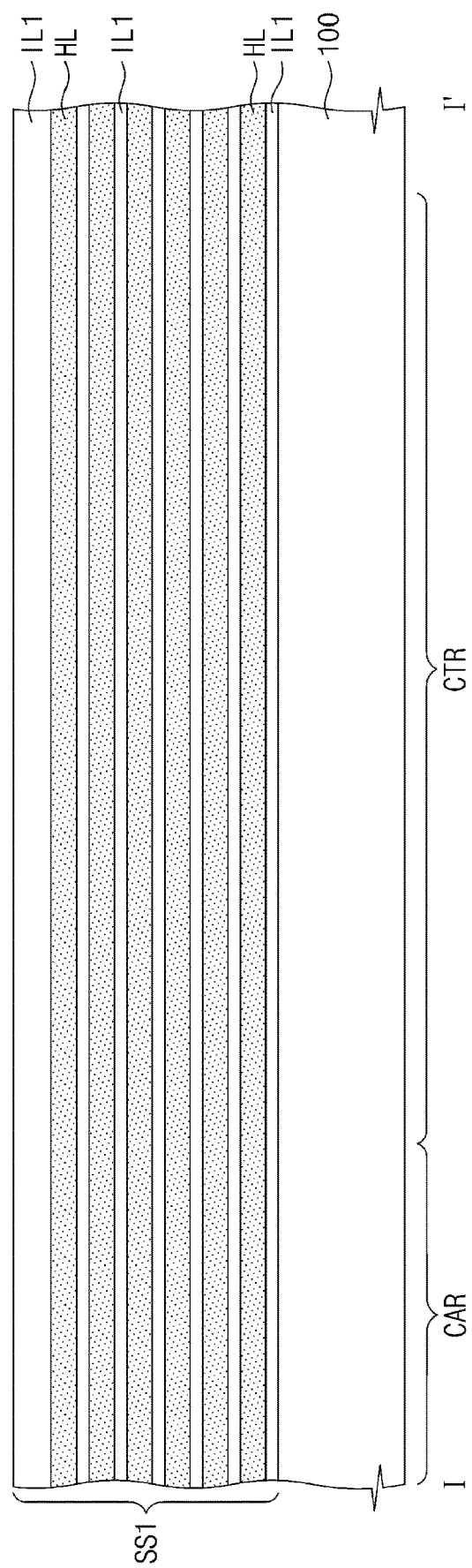

Referring to FIGS. 3 and 26, the lower structure SS1 may be formed on the substrate 100. A second insulating layer IL2 may be formed on the uppermost sacrificial layer HL of the lower structure SS1. The second insulating layer IL2 may be thicker than the first insulating layer IL1.

Figure 27:
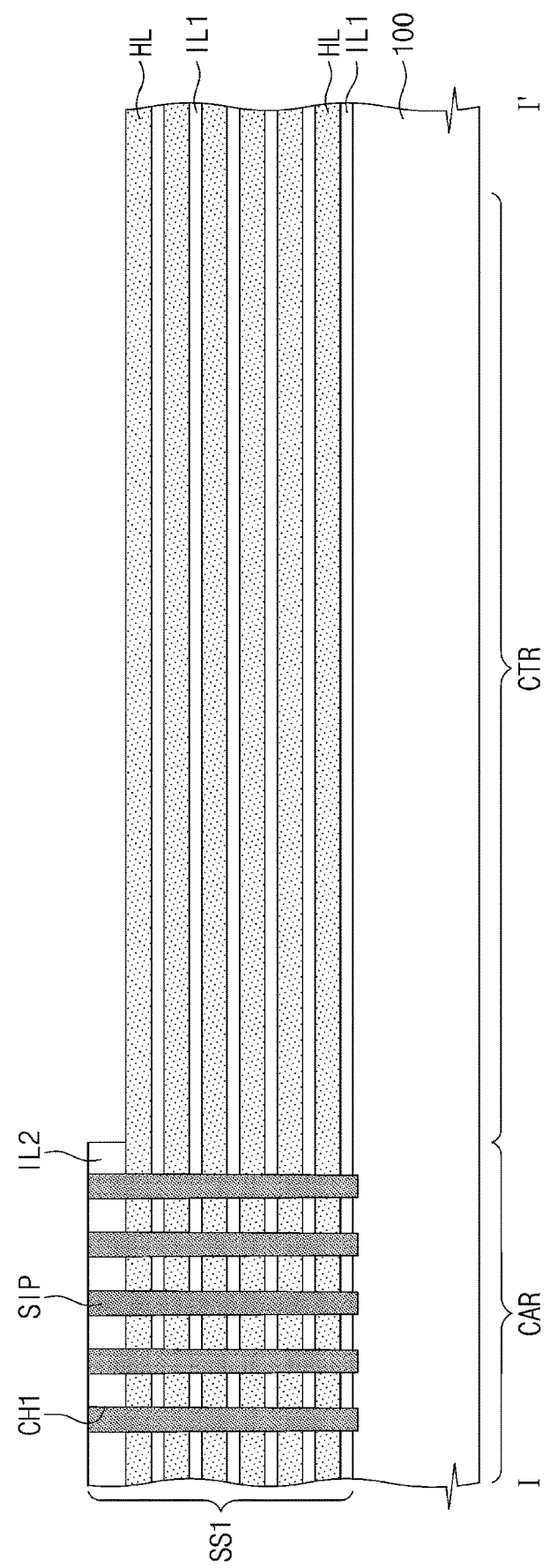

Referring to FIGS. 3 and 27, first channel holes CH1 may be formed to penetrate the lower structure SS1 on the cell array region CAR. The second insulating layer IL2 may be patterned to expose the uppermost sacrificial layer HL of the lower structure SS1 of the connection region CTR. The second insulating layer IL2 may remain on the cell array region CAR. Thus, a height difference may occur between the lower structure SS1 of the cell array region CAR and the lower structure SS1 of the connection region CTR.

Figure 28:
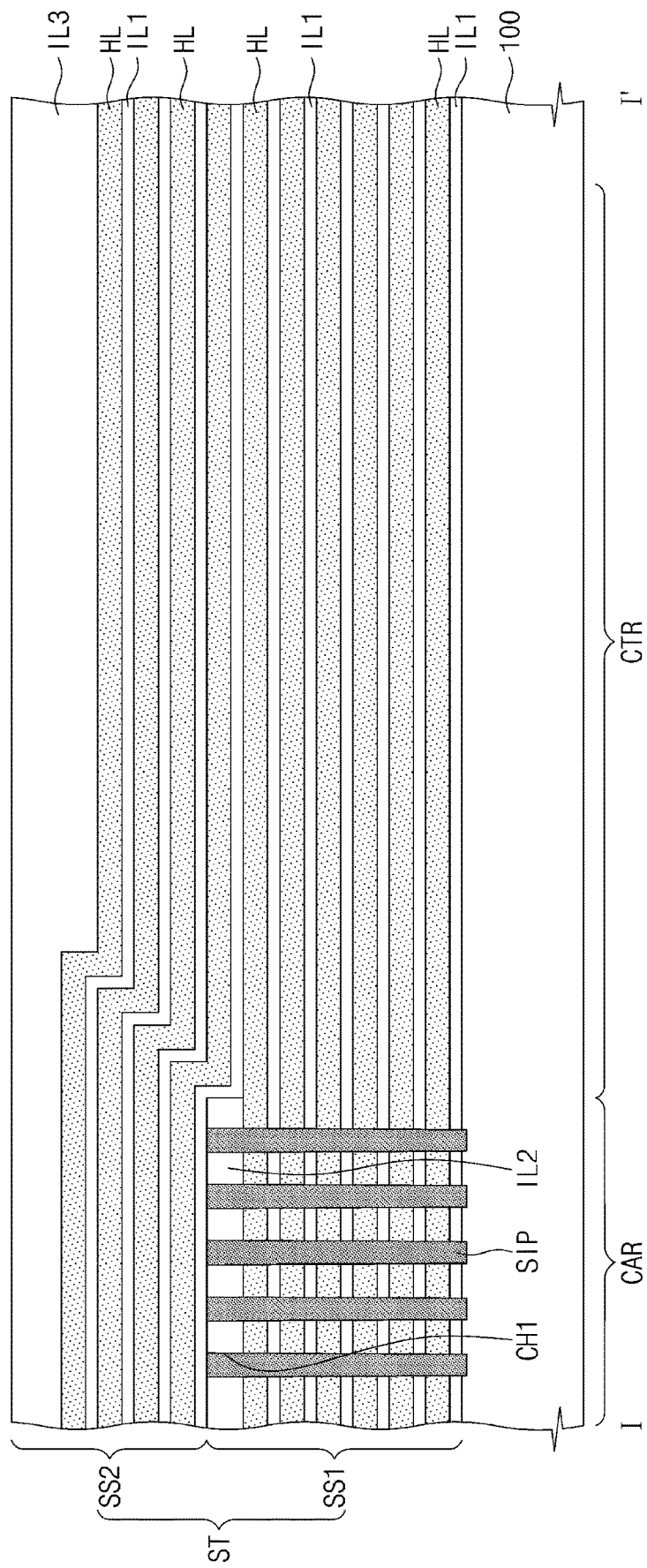

Referring to FIGS. 3 and 28, an upper structure SS2 may be formed on the lower structure SS. Due to the height difference between the lower structure SS1 of the cell array region CAR and the lower structure SS1 of the connection region CTR, the sacrificial layer HL of the upper structure SS2 may have a stepped structure while extending from the cell array region CAR onto the connection region CTR.

Referring to FIGS. 3 and 29, second channel holes CH2 may be formed to penetrate the upper structure SS2 on the cell array region CAR. The second channel holes CH2 may be misaligned with the first channel holes CH1 when the second channel holes CH2 are formed. In this case, the second insulating layer IL2 may prevent the sacrificial layer HL disposed thereunder from being etched.

A stair structure may be formed on the connection region CTR. According to the present embodiment, the sacrificial layers HL and the first insulating layers IL1 on the connection region CTR may be alternately stacked at equal vertical intervals. As a result, the stair structure on the connection region CTR may be formed without a defect.

Subsequent processes may be substantially the same as or similar to corresponding processes described above with reference to FIGS. 14 to 17.

The 3D semiconductor memory device according to exemplary embodiments of the inventive concepts may include the vertical channel structure completely penetrating the stack structure having a large number of stacked layers. Thus, the integration density and reliability of the 3D semiconductor memory device may be increased. In addition, embodiments of the inventive concepts may prevent a process defect which may occur when the second channel hole is misaligned with the first channel hole, and may also form the stair structure on the connection region without a defect.

While the inventive concepts have been described with reference to exemplary embodiments, it will be apparent to those skilled in the art that various changes and modifications may be made without departing from the spirits and scopes of the inventive concepts.

What is claimed is:

1. A three-dimensional (3D) semiconductor memory device, comprising:
   a substrate including a cell array region and a connection region;
   a stack structure disposed on the substrate and comprising a plurality of electrodes and first insulating layers disposed between the electrodes, the stack structure having a stair structure on the connection region;
   a vertical channel structure penetrating the stack structure on the cell array region; and
   a vertical dummy structure penetrating at least a portion of the stair structure on the connection region,
   wherein the stack structure further comprises: a second insulating layer selectively disposed on the cell array region and not disposed on the connection region,
   wherein a maximum thickness of the second insulating layer ranges from 1.5 times to 10 times a maximum thickness of the first insulating layer on the second insulating layer,
   wherein the vertical channel structure includes a portion of abrupt diameter change at a level of a top surface of the second insulating layer,
   wherein the portion of abrupt diameter change has: a surface which is parallel to the top surface of the second insulating layer and is substantially coplanar with the top surface of the second insulating layer, and
   wherein an upper portion of the portion of abrupt diameter change has a first diameter, and a lower portion of the portion of abrupt diameter change has a second diameter that is greater than the first diameter.

2. The 3D semiconductor memory device of claim 1, wherein a first electrode of the plurality of electrodes extends from a sidewall of the second insulating layer onto the connection region.

3. The 3D semiconductor memory device of claim 2, wherein the first electrode has a first thickness, and
   wherein a second electrode of the electrodes has a second thickness that is greater than the first thickness.

4. The 3D semiconductor memory device of claim 1, wherein a portion of the vertical dummy structure at the level of the top surface of the second insulating layer has a third diameter at its upper portion and has a fourth diameter at its lower portion, and wherein the fourth diameter is smaller than the third diameter.

5. The 3D semiconductor memory device of claim 1, wherein a sidewall of the vertical channel structure has a stepped profile at a level of the portion of abrupt diameter change.

6. The 3D semiconductor memory device of claim 5, wherein a sidewall of the vertical dummy structure has a flat profile at the level of the portion of abrupt diameter change.

7. The 3D semiconductor memory device of claim 1, wherein the vertical channel structure and the vertical dummy structure include different layers.

8. The 3D semiconductor memory device of claim 1, wherein the vertical channel structure and the vertical dummy structure include the same layers.

9. The 3D semiconductor memory device of claim 1, wherein the vertical dummy structure comprises a lower dummy structure and an upper dummy structure, and
   wherein the upper dummy structure at least partially overlaps the lower dummy structure in a cross-sectional view.

* * * * *